(12) United States Patent
Nagayama et al.

(10) Patent No.: US 9,343,487 B2
(45) Date of Patent: May 17, 2016

(54) THIN FILM TRANSISTOR SUBSTRATE AND MANUFACTURING METHOD THEREOF

(71) Applicant: Mitsubishi Electric Corporation, Tokyo (JP)

(72) Inventors: Kensuke Nagayama, Kumamoto (JP); Kazunori Inoue, Kumamoto (JP); Yasuyoshi Ito, Kumamoto (JP); Nobuaki Ishiga, Kumamoto (JP); Naoki Tsumura, Kumamoto (JP); Shinichi Yano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/839,470

(22) Filed: Aug. 28, 2015

(65) Prior Publication Data
US 2015/0372027 A1    Dec. 24, 2015

(30) Foreign Application Priority Data
Apr. 26, 2013    (JP) .................................. 2013-093330

(51) Int. Cl.
| | |
|---|---|
| H01L 21/48 | (2006.01) |
| H01L 27/12 | (2006.01) |
| H01L 29/423 | (2006.01) |
| H01L 29/66 | (2006.01) |
| H01L 29/786 | (2006.01) |

(52) U.S. Cl.
CPC .......... *H01L 27/1259* (2013.01); *H01L 27/124* (2013.01); *H01L 27/1225* (2013.01); *H01L 27/1248* (2013.01); *H01L 27/1255* (2013.01); *H01L 29/42384* (2013.01); *H01L 29/66969* (2013.01); *H01L 29/7869* (2013.01)

(58) Field of Classification Search
CPC ............ H01K 27/1225; H01K 27/124; H01K 27/1248; H01K 27/7869; H01K 27/1259; H01K 27/42384; H01K 27/66868; H01K 27/1255
USPC .................................................. 438/144–152
See application file for complete search history.

(56) References Cited

U.S. PATENT DOCUMENTS

| | | | |
|---|---|---|---|
| 5,132,819 | A | 7/1992 | Noriyama et al. |
| 5,636,329 | A | 6/1997 | Sukegawa et al. |

(Continued)

FOREIGN PATENT DOCUMENTS

| | | |
|---|---|---|
| JP | H08-006059 A | 1/1996 |
| JP | 2001-056474 A | 2/2001 |

(Continued)

OTHER PUBLICATIONS

Kenji Nomura et al., "Room-temperature fabrication of transparent flexible thin-film transistors using amorphous oxide semiconductors", Nature 2004, vol. 432, pp. 488-492.

*Primary Examiner* — Michael Lebentritt
(74) *Attorney, Agent, or Firm* — Studebaker & Brackett PC

(57) ABSTRACT

A TFT substrate includes a TFT including a source electrode having a lower source electrode and an upper source electrode, which are electrically connected to each other, and a drain electrode having a lower drain electrode and an upper drain electrode, which are electrically connected to each other. The lower source electrode and the lower drain electrode are in contact with a lower surface of the semiconductor film, and the upper source electrode and the upper drain electrode are in contact with an upper surface of the semiconductor film.

3 Claims, 23 Drawing Sheets

(56) References Cited

U.S. PATENT DOCUMENTS

| | | |
|---|---|---|
| 6,078,365 A | 6/2000 | Ueda et al. |
| 6,313,889 B1 | 11/2001 | Song et al. |
| 6,449,026 B1 | 9/2002 | Min et al. |
| 6,654,073 B1 | 11/2003 | Maruyama et al. |
| 8,324,612 B2 | 12/2012 | Lee et al. |
| 9,190,420 B2 * | 11/2015 | Nagayama .......... H01L 27/1225 |
| 2003/0075715 A1 | 4/2003 | Satoh et al. |
| 2004/0150768 A1 | 8/2004 | Shimizu et al. |
| 2004/0222419 A1 | 11/2004 | Matsui et al. |
| 2006/0066790 A1 | 3/2006 | Tanaka et al. |
| 2006/0132682 A1 | 6/2006 | Yang et al. |
| 2007/0040977 A1 | 2/2007 | Kurosawa et al. |
| 2008/0093598 A1 | 4/2008 | Tsubata et al. |
| 2008/0129908 A1 | 6/2008 | Nomura et al. |
| 2009/0189153 A1 | 7/2009 | Iwasaki et al. |
| 2009/0195723 A1 | 8/2009 | Araki et al. |
| 2009/0244419 A1 | 10/2009 | Nakamura et al. |
| 2010/0033643 A1 | 2/2010 | Horiuchi et al. |
| 2010/0118058 A1 | 5/2010 | Murai et al. |
| 2010/0277661 A1 | 11/2010 | Ueda et al. |
| 2011/0170027 A1 | 7/2011 | Nakanishi et al. |
| 2011/0310340 A1 | 12/2011 | Nakamura et al. |
| 2012/0043543 A1 | 2/2012 | Saito et al. |
| 2012/0235149 A1 | 9/2012 | Ochi |
| 2013/0037800 A1 | 2/2013 | Matsukizono |
| 2013/0088677 A1 | 4/2013 | Kinoshita et al. |
| 2013/0250200 A1 | 9/2013 | Ohue |
| 2013/0321492 A1 | 12/2013 | Tanaka |
| 2014/0070211 A1 | 3/2014 | Iwasaki et al. |

FOREIGN PATENT DOCUMENTS

| | | |
|---|---|---|
| JP | 2003-092410 A | 3/2003 |
| JP | 2005-077822 A | 3/2005 |
| JP | 2006-005329 A | 1/2006 |
| JP | 2007-281409 A | 10/2007 |

* cited by examiner

F I G. 2
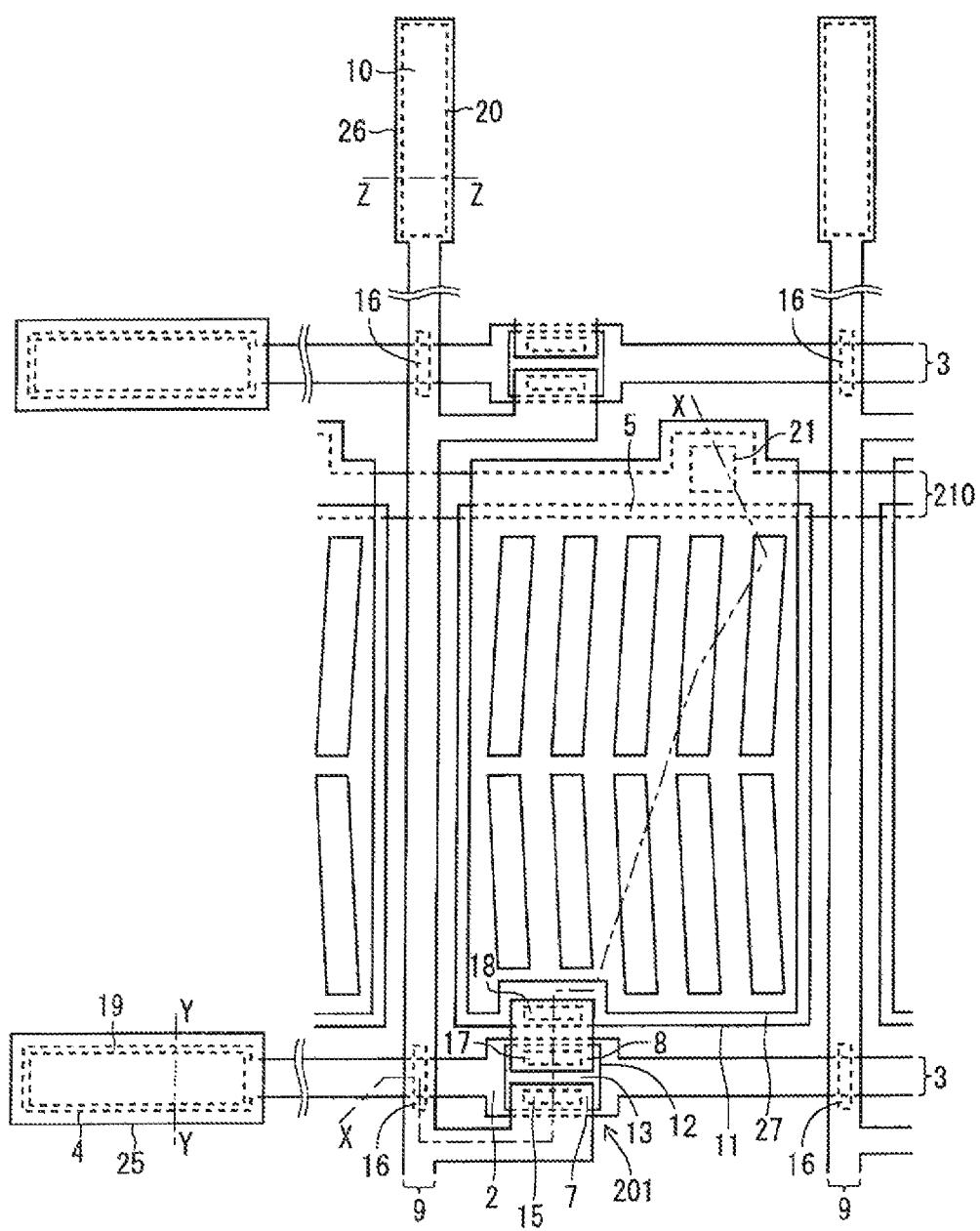

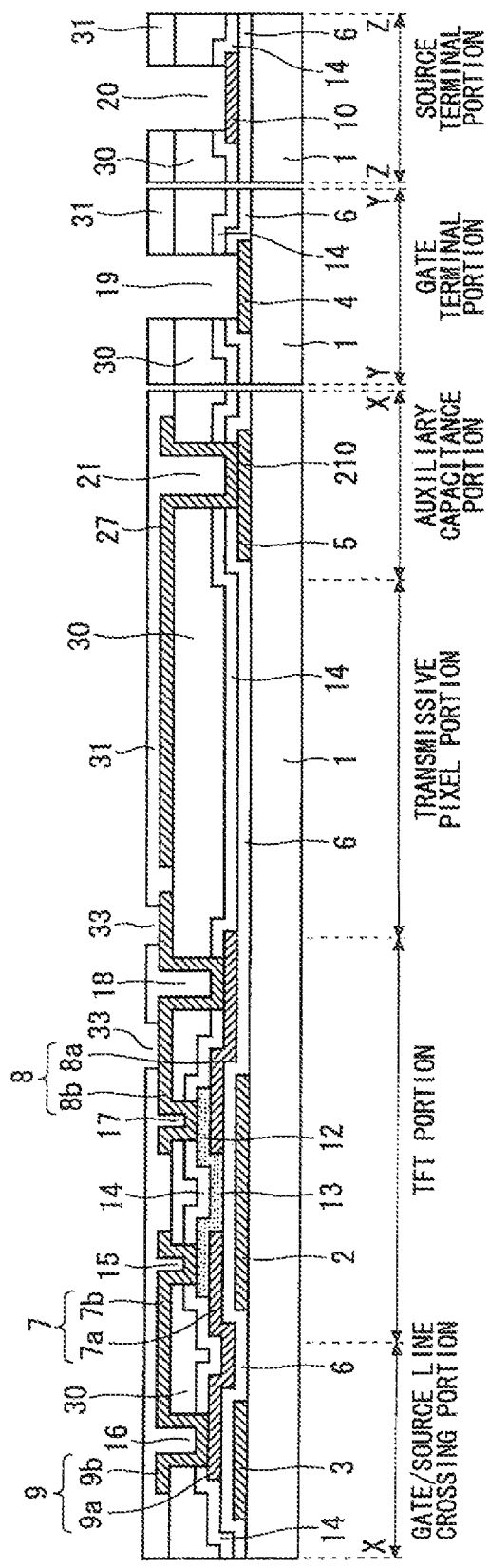

THIN FILM TRANSISTOR SUBSTRATE AND MANUFACTURING METHOD THEREOF

BACKGROUND OF THE INVENTION

1. Field of the Invention

The present invention relates to a thin film transistor substrate used in a display device or the like.

2. Description of the Background Art

A TFT active matrix substrate (thin film transistor substrate; hereinafter referred to as a "TFT substrate") using a thin film transistor (hereinafter referred to as a "TFT") as a switching element is used in an electrooptical device such as a display device (liquid crystal display) using liquid crystal. A semiconductor device such as a TFT has features of reduced power consumption and thin size, and it has actively been applied to a flat panel display that replaces a CRT (Cathode Ray Tube) by utilizing these features.

An electrooptical element for a liquid crystal display (LCD) includes a simple matrix LCD and a TFT-LCD using a TFT as a switching element. The TFT-LCD is particularly more excellent than the CRT or the simple matrix LCD in portability and display quality, so that it has widely been put into practical use such as a notebook personal computer.

In general, a TFT-LCD includes a liquid crystal display panel having a liquid crystal layer held therein between a TFT substrate having a plurality of TFTs arranged in an array and a counter substrate having a color filter and the like. A polarization plate is provided on each of a front surface and a back surface of the liquid crystal display panel, and a backlight is further provided on one of these surfaces. This configuration can realize a satisfactory color display.

An LCD with an IPS (In Plane Switching) system that is a liquid crystal driving system using a transverse electric field and attained by improving a viewing angle of a conventional TFT-LCD has widely been used for a display device and the like by utilizing the feature of wide viewing angle. However, it also has problems of low opening ratio and low transmittance on a pixel display portion, and it is difficult to attain a bright display characteristic. The main reason for this is that an electric field for driving liquid crystal is not effectively applied above an interdigital pixel electrode used for the IPS-LCD, and hence, some liquid crystals on the pixel electrode do not operate. In order to solve this problem, an LCD with an FFS (Fringe Field Switching) system described in Japanese Patent Application Laid-Open No. 2001-56474 has been proposed.

A TFT substrate in a general FFS-LCD described in Japanese Patent Application Laid-Open No. 2001-56474 is formed through at least six photolithography processes including (1) a process of forming a gate electrode, (2) a process of forming a pixel electrode, (3) a process of forming a gate insulating film and a semiconductor film, (4) a process of forming source and drain electrodes, (5) a process of forming contact holes on a protection insulating film, and (6) a process of forming a common electrode.

Amorphous silicon (Si) is conventionally used as a semiconductor film serving as an active layer (channel layer) in a switching element in a TFT substrate for a liquid crystal display. Recently, development of a TFT using an oxide semiconductor for an active layer has been actively made. An oxide semiconductor has mobility higher than that of a conventional amorphous silicon. As the oxide semiconductor, zinc oxide (ZnO) materials or amorphous InGaZnO materials formed by adding gallium oxide ($Ga_2O_3$) and indium oxide ($In_2O_3$) to zinc oxide are mainly used. This technique is described in Japanese Patent Application Laid-Open No. 2005-77822, Japanese Patent Application Laid-Open No. 2007-281409, and Kenji Nomura et al., "Room-temperature fabrication of transparent flexible thin-film transistors using amorphous oxide semiconductors", Nature 2004, vol. 432, pages 488 to 492.

An oxide semiconductor material can be etched by a weak acid solution such as oxalic acid or carboxylic acid, like an oxide conductor such as amorphous ITO (indium oxide ($In_2O_3$)+tin oxide ($SnO_2$)) that is a transparent conductor or amorphous InZnO (indium oxide ($In_2O_3$)+zinc oxide (ZnO)), so that it has an advantage of easy pattern formation.

However, the oxide semiconductor material is easy to be dissolved even in an acid solution used for an etching process of a metal film (Cr, Ti, Mo, Ta, Al, Cu, and an alloy of these metals) generally used for a source electrode or a drain electrode in a TFT. Accordingly, when a TFT having a structure in which a source electrode and a drain electrode are arranged on an upper layer of an oxide semiconductor is manufactured as illustrated in FIG. 11 in Japanese Patent Application Laid-Open No. 2007-281409, a selective etching in which only a metal film of the source electrode and the drain electrode is etched and the oxide semiconductor is not etched and left is difficult.

In order to solve this problem, it is considered that a TFT structure including a semiconductor film as an active layer formed on a source electrode and a drain electrode is employed as illustrated in FIG. 1 in Japanese Patent Application Laid-Open No. 2003-92410 and FIG. 1A in Japanese Patent Application Laid-Open No. 2006-5329, for example. In this TFT structure, it is only necessary that, after the gate electrode, the source electrode, and the drain electrode are formed by processing the metal film, the semiconductor film made of an oxide semiconductor is formed. Therefore, there is no chance that the semiconductor film is dissolved in an acid solution upon etching the metal film. In addition, since a weak acid solution such as oxalic acid or carboxylic acid used upon etching the oxide semiconductor does not etch a normal metal, the source electrode and the drain electrode are not etched during the formation of the semiconductor film. Accordingly, the selective etching of the semiconductor film made of an oxide semiconductor and the metal film can be carried out, whereby a high-performance TFT substrate having high mobility can be manufactured.

There is no problem in the case described in Japanese Patent Application Laid-Open No. 2001-56474 in which the transparent conductive film pattern becomes the uppermost layer. However, as described in Japanese Patent Application Laid-Open No. 08-6059 (1996), when an insulating film (hereinafter referred to as "upper insulating film") such as a protection film or an interlayer insulating film is formed on a transparent conductive film pattern, stress of the transparent conductive film and stress of the upper insulating film is unbalanced, so that a phenomenon called "film floating" or "film stripping" (hereinafter collectively referred to as "film floating") in which the upper insulating film is peeled on the edge of the transparent conductive film pattern might occur. The film floating prominently occurs on a region where the pattern density is relatively coarse, such as on a frame region outside a display region, e.g., on an external connection terminal portion or a wiring conversion portion. The occurrence of the film floating deteriorates the function of the upper insulating film as the protection film to cause corrosion, or deteriorates the function of the interlayer insulating film to cause breakdown. Therefore, when the film floating occurs, yield of products and reliability is deteriorated. In addition, the peeled upper insulating film scatters in a manufacturing device to generate dust, which adversely affects other products manufactured by the same manufacturing device. This also deteriorates yield of products and reliability.

On the other hand, when a film-forming condition that makes it difficult to cause the film floating due to the balanced stress is employed upon forming the upper insulating film, problems arise including a problem of reduction in transmittance of the transparent conductive film pattern, and a problem of occurrence of connection failure between a line and a pixel electrode due to a formation of a wedge-like gap (hereinafter merely referred to as "wedge") on an interface of a gate insulating film and an interlayer insulating film in a contact hole connecting the line and the pixel electrode. Particularly, in a liquid crystal display highly demanded to have high brightness (high open ratio and high transmittance) and wide viewing angle, enhancement in transmittance of a transparent conductive film and an adoption of an FFS system are inevitable, which increases the case in which such a film-forming condition as to be liable to generate the film floating in the upper insulating film has to be employed.

In addition, in the FFS system, it is essential that a pixel electrode and a common electrode both made of a transparent conductive film are arranged opposite to each other via an interlayer insulating film, so that the interlayer insulating film (upper insulating film) is unavoidably arranged on at least one of the transparent electrodes. Therefore, a countermeasure for the film-floating problem has to be devised.

When a film made of an oxide semiconductor such as ZnO or InGaZnO is directly formed on a metal film (Cr, Ti, Cu, Mo, Ta, Al, or an ally of these metals) serving as a source electrode or a drain electrode of a TFT by using a sputtering method or a vacuum deposition method, an oxide layer of the metal film is formed on the interface between both films due to an interface reaction, whereby the electric resistance (interface resistance) increases.

According to experiments conducted by the present inventors, when a metal film made of Al is formed on an oxide semiconductor film made of InGaZnO (ratio of number of atoms: In:Ga:Zn:O=1:1:1:4), for example, an interface resistance value per an area of 50 µm×50 µm is 200 kΩ, while an interface resistance value per the same area is 100 MΩ or more, when the formation order of the Al film and the InGaZnO film is reversed. As for other metals (Cr, Ti, Cu, Mo, Ta), the interface resistance value increases in single or more digits, when the formation order of the metal film and the InGaZnO film is reversed, as in the case of Al. The same applies to the case where an alloy film having these metal films as a main component (the component having the highest ratio of number of contained atoms) is used.

On the other hand, a reduction reaction with the metal film occurs on the oxide semiconductor film, so that an oxide semiconductor film with insufficient oxygen is generated on the channel surface near the interface. In the oxide semiconductor film with insufficient oxygen, the carrier density increases to reduce resistance, which entails a problem of an increase in off current of the TFT. In the TFT structure in which the semiconductor film made of the oxide semiconductor is formed on the source electrode and the drain electrode, which are made of the metal film, the interface reaction layer increases. Consequently, the deterioration in on/off performance of the TFT and the reduction in mobility are generated, which entails a problem of deterioration in TFT characteristic.

SUMMARY OF THE INVENTION

An object of the present invention is to obtain satisfactory connection property between a semiconductor layer and source/drain electrodes in a TFT substrate that includes a TFT using an oxide semiconductor for a semiconductor film and is driven by using a transverse electric field, to prevent film floating of an insulating film on a transparent conductive film, and to suppress interface reaction between the semiconductor film and source and drain electrodes.

A thin film transistor substrate according to the present invention includes a gate electrode and an auxiliary capacitance electrode, which are formed on a substrate, and a first insulating film formed to cover the gate electrode and the auxiliary capacitance electrode. A lower source electrode, a lower drain electrode, and a pixel electrode connected to the lower drain electrode are formed on the first insulating film. A semiconductor film electrically connected to the lower source electrode and the lower drain electrode is formed on the lower source electrode and the lower drain electrode. A second insulating film is formed on the lower source electrode, the lower drain electrode, and the semiconductor film. An upper source electrode electrically connected to the semiconductor film and the lower source electrode through a contact hole, an upper drain electrode electrically connected to the semiconductor film and the lower drain electrode through a contact hole, and a common electrode electrically connected to the auxiliary capacitance electrode through a contact hole are formed on the second insulating film.

Since the source electrode and the drain electrode are electrically connected to upper and lower surfaces of the semiconductor film, a contact area with the semiconductor film increases, whereby an interface resistance can be reduced. Even if a failure in the interface resistance occurs on one of the surfaces of the semiconductor layer, this failure can be compensated on the other surface. Therefore, occurrence of defect caused by characteristic defect of the thin film transistor can be prevented.

In particular, a TFT substrate having high operating speed and a display device using the TFT substrate can be manufactured with good yield by using an oxide semiconductor having high mobility for a semiconductor film. Accordingly, a high-performance TFT substrate and a liquid crystal display can be manufactured with good productivity.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view illustrating a planar configuration of a pixel of the TFT substrate according to a first preferred embodiment;

FIGS. 18 to 23 are sectional views illustrating a manufacturing process of the TFT substrate according to the third preferred embodiment.

DESCRIPTION OF THE PREFERRED EMBODIMENTS

First Preferred Embodiment

Figure 1:
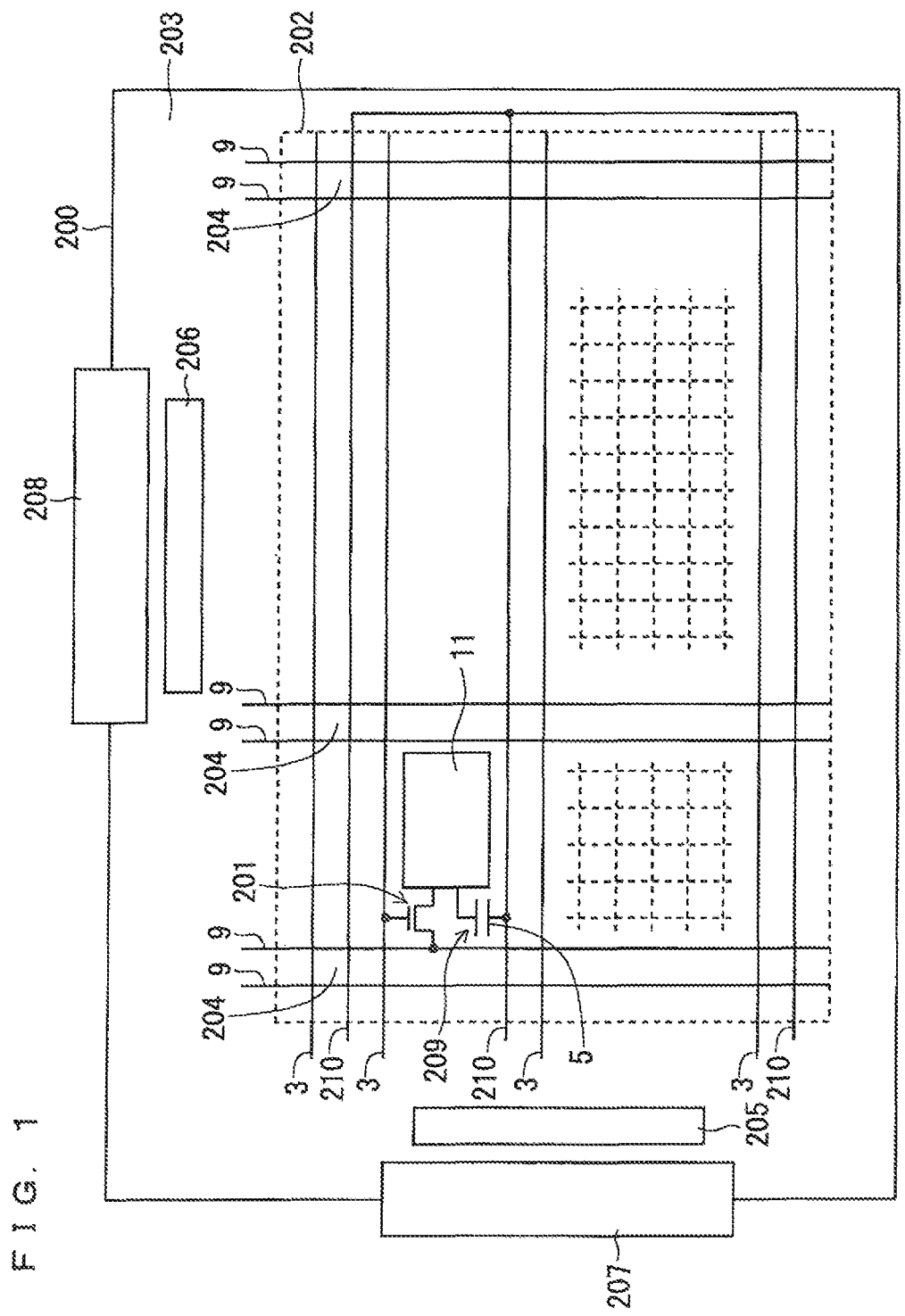
FIG. 1 is a plan view for schematically describing an overall structure of a TFT substrate.

FIG. 1 is a plan view illustrating a configuration of a TFT substrate according to a first preferred embodiment. The TFT substrate according to the first preferred embodiment is an active matrix substrate including a plurality of thin film transistors (TFTs), which serve as a switching element and are arranged in a matrix. In the present preferred embodiment, the TFT substrate for a liquid crystal display (LCD) that is a planar display device (flat panel display) will be described as one example.

A TFT substrate 200 is divided into a display region 202 in which pixels 204, each having a TFT 201, are arranged in a matrix and a frame region 203 externally enclosing the display region 202.

A plurality of gate lines (scanning signal lines) 3 and a plurality of source lines (display signal lines) 9 are arranged on the display region 202. The plurality of gate lines 3 are arranged parallel to one another, and the plurality of source lines 9 are also arranged parallel to one another. The plurality of gate lines 3 and the plurality of source lines 9 cross each other. In FIG. 1, the gate lines 3 extend in the horizontal direction, and the source lines 9 extend in the longitudinal direction. The region enclosed by the adjacent gate line 3 and the adjacent source line 9 is specified as the pixel 204. Therefore, the pixels 204 are arranged in a matrix in the display region 202.

In FIG. 1, one pixel 204 is representatively illustrated as enlarged. At least one TFT 201 is arranged on the pixel 204. The TFT 201 is arranged in the vicinity of the crossing point of the source line 9 and the gate line 3, and includes a gate electrode connected to the gate line 3, a source electrode connected to the source line 9, and a drain electrode connected to a pixel electrode 11. The pixel electrode 11 forms auxiliary capacitance 209 with an auxiliary capacitance electrode 5, in which the auxiliary capacitance electrode 5 is connected to an auxiliary capacitance line 210 to which a predetermined common potential is supplied. The auxiliary capacitance line 210 extends parallel to the gate line 3 (orthogonal to the source line 9), and the gate line 3 and the auxiliary capacitance line 210 are alternately arranged.

On the other hand, a scanning signal drive circuit 205 and a display signal drive circuit 206 are provided on the frame region 203 of the TFT substrate 200. Although not illustrated, the gate line 3 is extracted from the display region 202 to the frame region 203 on the side where the scanning signal drive circuit 205 is provided, and connected to the scanning signal drive circuit 205. Similarly, the source line 9 is extracted from the display region 202 to the frame region 203 on the side where the display signal drive circuit 206 is provided, and connected to the display signal drive circuit 206.

A connection substrate 207 for connecting the scanning signal drive circuit 205 to the outside is provided in the vicinity of the scanning signal drive circuit 205, while a connection substrate 208 for connecting the display signal drive circuit 206 to the outside is provided in the vicinity of the display signal drive circuit 206. These connection substrates 207 and 208 are wiring boards such as an FPC (Flexible Printed Circuit), for example.

Various control signals are externally supplied to the scanning signal drive circuit 205 via the connection substrate 207, while various control signals and image data are externally supplied to the display signal drive circuit 206 via the connection substrate 208. The scanning signal drive circuit 205 supplies a gate signal (scanning signal) to the gate line 3 based upon the external control signal. The gate line 3 is selected, one by one, in a predetermined cycle based upon the gate signal. The display signal drive circuit 206 supplies a display signal according to the image data to the source line 9 based upon the external control signal. According to the operations of the scanning signal drive circuit 205 and the display signal drive circuit 206, a display voltage according to the display signal is supplied to each pixel 204.

The scanning signal drive circuit 205 and the display signal drive circuit 206 are not limited to be provided on the TFT substrate 200, and they may be formed by using a TCP (Tape Carrier Package) and may be connected to the TFT substrate 200. As described later, the auxiliary capacitance electrode 5 is arranged to be overlapped (superimposed) on the pixel electrode 11 in plan view to form the auxiliary capacitance 209 having the pixel electrode 11 as one electrode and the auxiliary capacitance electrode 5 as another electrode. The auxiliary capacitance electrode 5 in each pixel 204 is connected to the auxiliary capacitance line 210 to be bundled, and a predetermined common potential is supplied thereto from the scanning signal drive circuit 205 or the display signal drive circuit 206, for example.

The TFT 201 functions as a switching element for supplying the display voltage to the pixel electrode 11, and controlled to be on/off by the gate signal applied to the gate electrode from the gate line 3. When the TFT 201 is turned on, the display voltage supplied to the drain electrode from the source line 9 is applied to the pixel electrode 11, whereby an electric field according to the display voltage is generated between the pixel electrode 11 and a common electrode (not illustrated). Capacitance (liquid crystal capacitance) parallel with the auxiliary capacitance 209 is formed between the pixel electrode 11 and the common electrode via the liquid crystal. The display voltage applied to the pixel electrode 11 is held for a certain period of time by the liquid crystal capacitance and the auxiliary capacitance 209.

In the case of a liquid crystal display, a counter substrate is arranged opposite to the TFT substrate 200. The counter substrate is a color filter substrate, for example, and arranged on the front surface (recognizable side) of the TFT substrate. The counter substrate is provided with a color filter, a black matrix (BM), and an orientation film, for example. The orientation film may also be formed on the surface of the TFT substrate 200. In a liquid crystal display driven by using a transverse electric field as in an FFS (Fringe Field Switching) system, the common electrode is arranged on the TFT substrate 200, not on the counter substrate.

The TFT substrate 200 and the counter substrate are adhered with a fixed gap (cell gap), and the liquid crystal fills the gap to be sealed, whereby a liquid crystal display panel is formed. Specifically, the liquid crystal display panel has a structure in which a liquid crystal layer is held between the TFT substrate 200 and the counter substrate. In addition, a polarizing plate, a wave plate, and the like are provided on the outer surface of the liquid crystal display panel. A backlight unit is provided on the back surface (the backside of the TFT substrate 200) of the liquid crystal display panel.

An operation of the liquid crystal display will briefly be described. The liquid crystal held between the TFT substrate 200 and the counter substrate is driven (the orientation direction thereof is controlled) by the electric field generated between the pixel electrode 11 and the common electrode. When the orientation direction of the liquid crystal changes, the polarizing state of light passing through the liquid crystal changes. Therefore, light from the backlight unit having passed through the polarizing plate and converted into linearly polarized light changes the polarized state when passing through the liquid crystal layer of the liquid crystal display panel. Specifically, the light from the backlight unit becomes linearly polarized light by the polarizing plate close to the TFT substrate 200. The linearly polarized light changes the polarized state by passing through the liquid crystal layer.

In the light passing through the liquid crystal layer, the quantity of light passing through the polarizing plate close to the counter substrate is changed depending on the polarized state. Specifically, in the light being transmitted through the liquid crystal display panel from the backlight unit, the quantity of light passing through the polarizing plate on the recognizable side changes. The orientation direction of the liquid crystal changes according to the display voltage applied to the pixel electrode 11. Therefore, the quantity of light passing through the polarizing plate on the recognizable side can be controlled by controlling the display voltage. The liquid crystal display displays a desired image by controlling the display voltage, applied to each pixel, based upon the display data.

Figure 3:
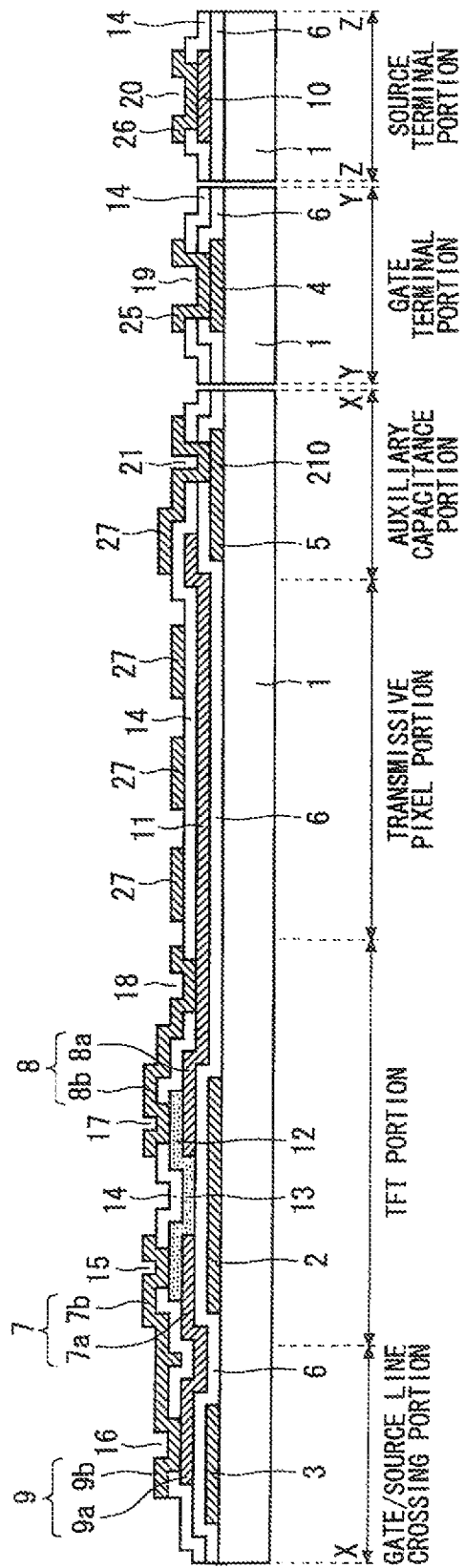
FIG. 3 is a view illustrating a sectional configuration of the pixel of the TFT substrate according to the first preferred embodiment.

Next, the detailed structure of the TFT substrate 200 according to the present preferred embodiment will be described with reference to FIGS. 2 and 3. FIG. 2 is a view illustrating a planar configuration of an essential part including the pixel 204 on the TFT substrate 200 using the FFS system, and FIG. 3 is a view illustrating its sectional configuration. FIG. 3 illustrates the sections corresponding to X-X line, Y-Y line, and Z-Z line in FIG. 2. The section along X-X line corresponds to a formation region of the pixel 204 (pixel portion). The section along Y-Y line corresponds to a formation region of the gate terminal 4 and a gate terminal pad 25 (gate terminal portion) for supplying the gate signal to the gate line 3. The section along Z-Z line corresponds to a formation region of the source terminal 10 and a source terminal pad 26 (source terminal portion) for applying the display signal to the source line 9.

The section of the pixel portion along X-X line includes a "gate/source line crossing portion" where the gate line 3 and the source line 9 cross each other, a "TFT portion" that is a formation region of the TFT 201, a "transmissive pixel portion" that is a formation region of the pixel electrode 11 and the common electrode 27, and an "auxiliary capacitance portion" that is a formation region of the auxiliary capacitance 209, as illustrated in FIG. 3.

As illustrated in FIG. 3, the TFT substrate 200 is formed by using a substrate 1 that is a transparent insulating substrate made of a glass, for example. The gate line 3, the gate electrode 2, the auxiliary capacitance electrode 5, the auxiliary capacitance line 210, and the gate terminal 4 are formed on the substrate 1. An insulating film 6 is formed to cover these components. Since the insulating film 6 functions as a gate insulating film on the TFT portion, it is referred to as a "gate insulating film" below.

In FIG. 2, the gate line 3 extends in the horizontal direction. The gate electrode 2 on the TFT 201 is a part of the gate line 3. Specifically, the portion of the gate line 3 on the TFT portion serves as the gate electrode 2. The gate electrode 2 has a width larger than that of the other portion of the gate line 3. The gate terminal 4 is formed on one end of the gate line 3. The auxiliary capacitance line 210 extends parallel to the gate line 3, and a part thereof serves as the auxiliary capacitance electrode 5.

As illustrated in FIG. 3, on the TFT substrate 200 according to the present preferred embodiment, each of the source line 9, the source electrode 7, and the drain electrode 8 includes two layers, which are upper and lower layers, sandwiching a protection insulating film 14. Specifically, the source line 9 includes a lower source line 9a and an upper source line 9b, the source electrode 7 includes a lower source electrode 7a and an upper source electrode 7b, and the drain electrode 8 includes a lower drain electrode 8a and an upper drain electrode 8b.

The lower source line 9a, the lower source electrode 7a, the lower drain electrode 8a, the pixel electrode 11, and the source terminal 10 are formed on the gate insulating film 6. The lower source electrode 7a and the lower drain electrode 8a are formed to be superimposed on the gate electrode 2, but are arranged to be separated from each other. A channel region of the TFT 201 is formed on the region between the lower source electrode 7a and the lower drain electrode 8a.

In FIG. 2, the source line 9 (the lower source line 9a and the upper source line 9b) extends in the longitudinal direction. The lower source electrode 7a is formed to be connected to the lower source line 9a. Specifically, the portion branched from the lower source line 9a and extending to the TFT portion serves as the lower source electrode 7a.

The pixel electrode 11 is a plate electrode, and formed to be connected to the lower drain electrode 8a. Specifically, the portion of the pixel electrode 11 superimposed on the gate electrode 2 serves as the lower drain electrode 8a. The pixel electrode 11 is also locally superimposed on the auxiliary capacitance electrode 5 via the gate insulating film 6, and the auxiliary capacitance 209 is formed on this portion. In the transmissive liquid crystal display, the pixel electrode 11 is made of a translucent conductive film.

A semiconductor film 12 is formed to extend over the lower source electrode 7a and the lower drain electrode 8a (i.e., the semiconductor film 12 is also formed on the region between the lower source electrode 7a and the lower drain electrode 8a). The lower surface of the semiconductor film 12 is in contact with the lower source electrode 7a and the lower drain electrode 8a, whereby the lower source electrode 7a and the lower drain electrode 8a are both electrically connected to the semiconductor film 12. The semiconductor film 12 is formed in an island shape, and the portion located between the lower source electrode 7a and the lower drain electrode 8a serves as the channel region 13.

In the present preferred embodiment, an oxide semiconductor is used as the semiconductor film 12. More specifically, examples of a usable oxide semiconductor include an oxide semiconductor of zinc oxide (ZnO), and an InGaZnO oxide semiconductor formed by adding gallium oxide ($Ga_2O_3$) and indium oxide ($In_2O_3$) to zinc oxide (ZnO). Since the channel region 13 of the semiconductor film 12 is made of the oxide semiconductor, mobility higher than that of a semiconductor film using amorphous silicon can be realized.

The protection insulating film 14 is formed on the entire upper surface of the substrate 1 so as to cover the semiconductor film 12, the lower source line 9a, the lower source electrode 7a, the lower drain electrode 8a, the pixel electrode 11, and the source terminal 10. The channel region 13 of the TFT 201 is protected by the protection insulating film 14.

A plurality of contact holes are formed on the protection insulating film 14. Specifically, the contact holes are a contact hole 16 reaching the lower source line 9a, contact holes 15 and 17 reaching the semiconductor film 12, a contact hole 18 reaching the lower drain electrode 8a, a contact hole 21 reaching the auxiliary capacitance line 210, a contact hole 19 reaching the gate terminal 4, and a contact hole 20 reaching the source terminal 10 (the contact holes 19 and 21 penetrates not only the protection insulating film 14 but also the gate insulating film 6).

The contact hole 15 is formed on the position where it is superimposed on the lower source electrode 7a, and the contact hole 17 is formed on the position where it is superimposed on the lower drain electrode 8a. Accordingly, the contact holes 15 and 17 are formed on the positions where they are not superimposed on the channel region 13. The contact holes 16 are formed along the source line 9 with a constant interval as illustrated in FIG. 2.

The upper source line 9b, the upper source electrode 7b, the upper drain electrode 8b, the common electrode 27, the gate terminal pad 25, and the source terminal pad 26 are formed on the protection insulating film 14.

The upper source electrode 7b is formed to be connected to the upper source line 9b. Specifically, the portion branched from the upper source line 9b and extending to the TFT portion serves as the upper source electrode 7a. The upper source line 9b is in contact with the lower source line 9a through the contact hole 16, whereby the lower source line 9a and the upper source line 9b are electrically connected. The upper source electrode 7b is in contact with the semiconductor film 12 above the lower source electrode 7a through the contact hole 15, whereby the semiconductor film 12 and the upper source electrode 7b are electrically connected. Accordingly, the semiconductor film 12 and the source line 9 are electrically connected through the lower source electrode 7a, and electrically connected through the upper source electrode 7b.

The upper drain electrode 8b is in contact with the semiconductor film 12 above the lower drain electrode 8a through the contact hole 17, whereby the semiconductor film 12 and the upper drain electrode 8b are electrically connected. The upper drain electrode 8b is also in contact with the lower drain electrode 8a through the contact hole 18, whereby the lower drain electrode 8a and the upper drain electrode 8b are electrically connected. Accordingly, the semiconductor film 12 and the pixel electrode 11 are electrically connected through the lower drain electrode 8a, and also electrically connected through the upper drain electrode 8b.

As illustrated in FIG. 2, the common electrode 27 is an interdigital electrode having a slit, and is arranged opposite to the pixel electrode 11 via the protection insulating film 14. The common electrode 27 is in contact with the auxiliary capacitance line 210 through the contact hole 21, whereby the common electrode 27 and the auxiliary capacitance line 210 are electrically connected.

The gate terminal pad 25 is in contact with the gate terminal 4 through the contact hole 19, whereby the gate terminal pad 25 and the gate terminal 4 are electrically connected. The source terminal pad 26 is in contact with the source terminal 10 through the contact hole 20, whereby the gate terminal pad 25 and the source terminal 10 are electrically connected.

Subsequently, a manufacturing method of the TFT substrate 200 according to the first preferred embodiment will be described with reference to FIGS. 4 to 7. The components in FIGS. 4 to 7 corresponding to the components in FIG. 3 are identified by the same numerals.

Firstly, the substrate 1 is cleaned with cleaning liquid or pure water. In the present preferred embodiment, a glass substrate with a thickness of 0.5 mm is used as the substrate 1.

Then, a first conductive film that is a material of the gate electrode 2 and the gate line 3 is formed on the entire main surface of the cleaned substrate 1.

Examples of usable first conductive film include chrome (Cr), molybdenum (Mo), titanium (Ti), copper (Cu), tantalum (Ta), tungsten (W), aluminum (Al), and an alloy formed by adding a small amount of other elements to these metals. The first conductive film may have a stacked structure including two or more layers made of these metals or alloy. A low-resistance conductive film having a specific resistance value of not more than 50 μΩcm can be formed by using these metals or alloy.

In the present preferred embodiment, an Mo film is used as the first conductive film, and this Mo film is subjected to film formation to have a thickness of 200 nm by a sputtering method using Ar gas. Thereafter, a photoresist material is applied on the Mo film to form a photoresist pattern by the first photolithography process, and then, the Mo film is patterned by an etching process with the photoresist pattern being used as a mask. In this preferred embodiment, wet etching using a solution (PAN chemical) containing phosphoric acid, acetic acid, and nitric acid is performed.

Figure 4:
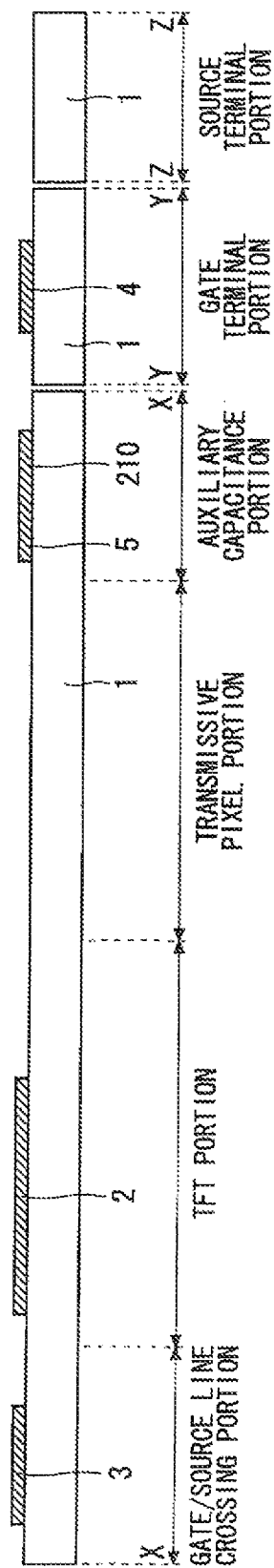
FIGS. 4 to 7 are sectional views illustrating a manufacturing process of the TFT substrate according to the first preferred embodiment.

Thereafter, the photoresist pattern is removed. As a result, the gate line 3, the gate electrode 2, the auxiliary capacitance electrode 5, the auxiliary capacitance line 210, and the gate terminal 4 are formed on the substrate 1 as illustrated in FIG. 4.

Next, the gate insulating film 6 is formed on the entire upper surface of the substrate 1. In the present preferred embodiment, an oxide silicon film (SiO) serving as the gate insulating film 6 is formed by using a chemical vapor deposition (CVD) method. In the present preferred embodiment, the oxide silicon film with a thickness of 300 nm is formed under a substrate heating condition of about 300° C. Since the oxide silicon film has low barrier property (blocking property) to impurity elements affecting the TFT characteristic, such as water content ($H_2O$), hydrogen ($H_2$), sodium (Na), and potassium (K), the gate insulating film 6 may have a stacked structure including a nitride silicon film (SiN), which has excellent barrier property, as a lower layer of the oxide silicon film, for example.

Thereafter, a second conductive film that is a material for the lower source electrode 7a, the lower drain electrode 8a, and the pixel electrode 11 is formed on the gate insulating film 6. In a transmissive liquid crystal display, a translucent pixel electrode 11 has to be formed. Therefore, a translucent conductive film is used as the second conductive film.

In the present preferred embodiment, an ITO film (a mixture ratio of indium oxide $In_2O_3$ and tin oxide $SnO_2$ is 90:10 (wt %), for example) is used as the second conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the second photolithography process, and the amorphous ITO film is etched by using the photoresist pattern as a mask. Wet etching using an oxalic acid solution can be used for this etching process.

Figure 5:
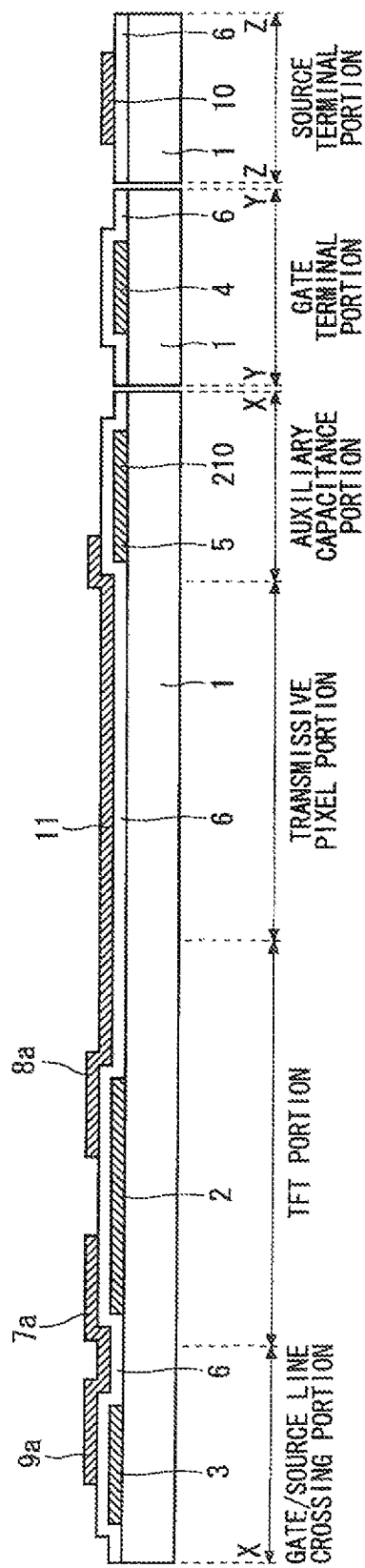

Thereafter, the photoresist pattern is removed. As a result, the lower source line 9a, the lower source electrode 7a, the lower drain electrode 8a, the pixel electrode 11, and the source terminal 10 are formed as illustrated in FIG. 5.

Then, the substrate 1 is heated at a temperature of 200° C. According to this heat treatment, the ITO film in the amorphous state is crystallized to become a polycrystalline ITO film. Since the ITO film in a polycrystalline state has excellent chemical stability, and is not dissolved into general etching chemical (containing oxalic acid) except for aqua regia (hydrochloric acid+nitric acid), etching selectivity with a metal film formed thereon in the subsequent process can be assured. The temperature in the heat treatment for crystallizing the amorphous ITO film has to be higher than at least a temperature (crystallization temperature) at which the crystallization of the amorphous ITO film is started. The crystallization temperature of an amorphous ITO film having a general composition is about 150° C.

Next, an oxide semiconductor that is a material for the semiconductor film 12 is formed. In the present preferred embodiment, an oxide (InGaZnO) containing In, Ga, and Zn is used as the oxide semiconductor. Here, an InGaZnO target having an atomic composition ratio of In:Ga:Zn:O is 1:1:1:4 is used, and the oxide semiconductor (InGaZnO film) is formed by a sputtering method using Ar gas.

In this case, the atomic composition ratio of oxygen is less than a stoichiometric composition, so that an oxide film with insufficient oxygen ion (in the example described above, the composition ratio of O is less than 4) is generally formed. Therefore, it is preferable that the sputtering is performed by adding oxygen gas ($O_2$) to Ar gas. In the present preferred embodiment, the InGaZnO film with a thickness of 50 nm is formed with the sputtering using a mixed gas formed by adding $O_2$ gas of 10% in a partial pressure percent to Ar gas. The InGaZnO film is formed to have an amorphous structure. The crystallization temperature of the InGaZnO film having the amorphous structure is generally 500° C. or higher, so that the most part in the film keeps the amorphous structure and is stabilized in this state at room temperature.

Figure 6:
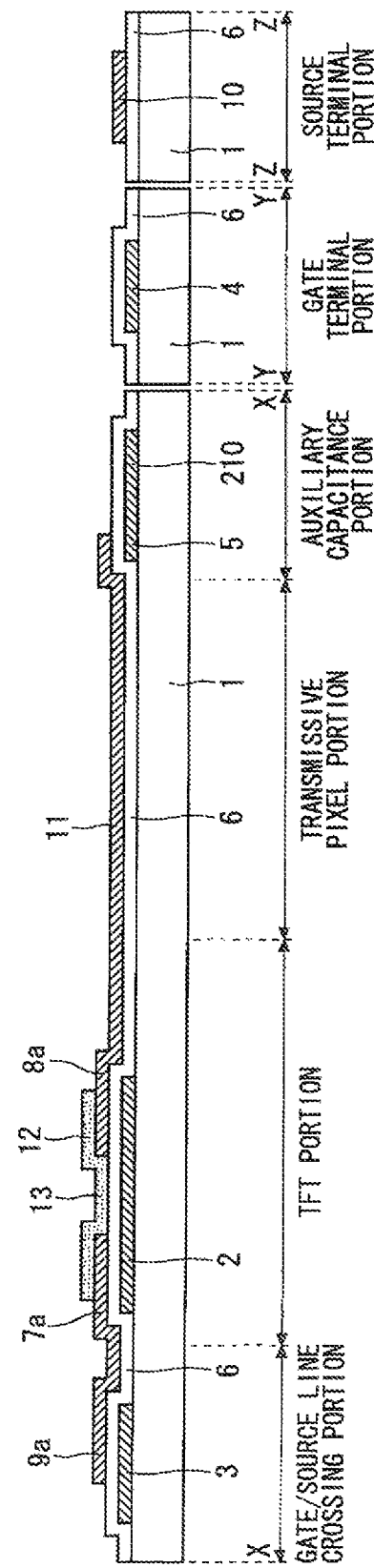

Next, a photoresist pattern is formed by the third photolithography process, and the InGaZnO film is etched by using this pattern as a mask. Thereafter, the photoresist pattern is removed. As a result, the semiconductor film 12 extending over the lower source electrode 7a and the lower drain electrode 8a is formed as illustrated in FIG. 6.

During the etching process of the InGaZnO film having the amorphous structure, wet etching using an oxalic acid solution can be employed. The lower source line 9a, the lower source electrode 7a, the lower drain electrode 8a, the pixel electrode 11, and the source terminal 10, which are formed in the previous process, are the crystallized ITO film, and they are not etched by the oxalic acid solution. Therefore, these patterns are not eliminated.

The semiconductor film 12 made of the oxide semiconductor (InGaZnO film) is brought into contact with the lower source electrode 7a and the upper source electrode 7b made of ITO that is also the oxide in order to electrically connect the semiconductor film 12 and the lower and upper source electrodes 7a and 7b. According to this configuration, the interface reaction (oxidation-reduction reaction) between the semiconductor film 12 and the lower and upper source electrodes 7a and 7b is prevented. Accordingly, the contact resistance (interface resistance) between the semiconductor film 12 and the lower and upper source electrodes 7a and 7b can be suppressed low. Consequently, on current and mobility of the TFT 201 can be increased, whereby an effect of enhancing the TFT characteristic can be obtained.

After the semiconductor film 12 is formed, the protection insulating film 14 is formed on the entire upper surface of the substrate 1. In the present preferred embodiment, an oxide silicon (SiO) film with a thickness of 300 nm is formed by using a chemical vapor deposition (CVD) method under the substrate heating condition of about 250° C.

A photoresist pattern is then formed by the fourth photolithography process, and the protection insulating film 14 and the gate insulating film 6 are etched by using this pattern as a mask, whereby the contact holes 15 to 21 are simultaneously formed. A dry etching process using fluorine gas can be used for this etching process.

Figure 7:
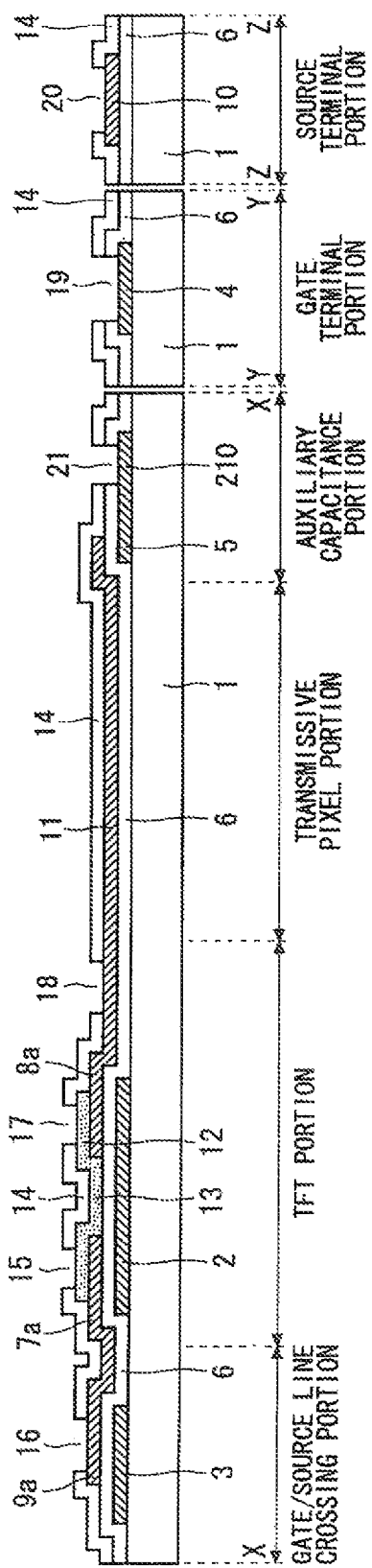

Thereafter, the photoresist pattern is removed. As a result, the contact hole 16 reaching the lower source line 9a, the contact holes 15 and 17 reaching the semiconductor film 12, the contact hole 18 reaching the lower drain electrode 8a, the contact hole 21 reaching the auxiliary capacitance line 210, the contact hole 19 reaching the gate terminal 4, and the contact hole 20 reaching the source terminal 10 are formed as illustrated in FIG. 7.

In the present preferred embodiment, the protection insulating film 14 is the oxide silicon film. However, the protection insulating film 14 may have a stacked structure including a nitride silicon film, which has excellent barrier property, as an upper layer of the oxide silicon film, for example, since the oxide silicon film has low barrier property (blocking property) to impurity elements affecting the TFT characteristic, such as water content ($H_2O$), hydrogen ($H_2$), sodium (Na), and potassium (K). Alternatively, the protection insulating film 14 may have a single-layer structure of a silicon nitride film.

When the silicon nitride is used for the protection insulating film 14, a wedge might be formed during the formation of the contact hole reaching the surface of the translucent conductive film by the dry etching using fluorine gas, and this wedge might cause an electrical connection failure. The effective structure for preventing the generation of the wedge is such that the protection insulating film 14 is formed to have a stacked structure having at least two layers including an upper silicon nitride film and a lower silicon nitride film, in which the lower silicon nitride film is formed to have a smaller absolute value of a film stress than the upper silicon nitride film. Specifically, the absolute value of the film stress of the lower silicon nitride film is preferably set in the range of 150 MPa to 200 MPa. When the N/Si ratio of the silicon nitride film is increased, the absolute value of the film stress can be decreased, but the N/Si ratio of the upper silicon nitride film is desirably in the range of 1.1 to 1.5. Alternatively, it is also effective that the protection insulating film 14 is formed to have a single-layer structure of a silicon nitride film having a small absolute value of a film stress.

Since the generation of the wedge is prevented, stress is balanced during the formation of the protection insulating film 14, whereby the film-forming condition that makes it difficult to generate the film floating is easy to be employed. Consequently, the film floating of the protection insulating film 14 can be prevented.

Thereafter, a third conductive film that is the material for the upper source electrode 7b, the upper drain electrode 8b, and the common electrode 27 is formed. In the present preferred embodiment, a translucent conductive film is formed as the third conductive film. An ITO film (a mixture ratio of indium oxide $In_2O_3$ and tin oxide $SnO_2$ is 90:10 (wt %), for example) is used as the translucent conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the fifth photolithography process, and the amorphous ITO film is etched by using the photoresist pattern as a mask. Wet etching using a solution containing phosphoric acid+nitric acid+acetic acid is used for this etching process. In this case, since the semiconductor film 12 made of the oxide semiconductor formed in the previous process is covered by the protection insulating film 14, the pattern of the semiconductor film 12 is not eliminated by the etching for the translucent conductive film, whereby the selective etching can be carried out.

Thereafter, the photoresist pattern is removed. As a result, the upper source line 9b, the upper source electrode 7b, the upper drain electrode 8b, the common electrode 27, the gate terminal pad 25, and the source terminal pad 26 are formed. Thus, the structure illustrated in FIG. 3 is completed.

As described above, in the first preferred embodiment, the high-performance TFT substrate 200 in which the oxide semiconductor is used for the semiconductor film 12 in the TFT 201 can be formed by five photolithography processes.

Upon assembling the liquid crystal display panel, an orientation film and a spacer are formed on the surface of the completed TFT substrate 200. The orientation film is a film for arraying the liquid crystal, and it is made of polyimide. A counter substrate that is separately formed to have a color filter or an orientation film is adhered to the TFT substrate 200. In this case, a gap is formed between the TFT substrate 200 and the counter substrate by the spacer. The liquid crystal fills this gap, whereby the liquid crystal display panel is completed. Finally, a polarizing plate, a wave plate, and a backlight unit are arranged outside the liquid crystal display panel. Thus, a liquid crystal display is completed.

In the present preferred embodiment, the semiconductor film 12 made of an oxide semiconductor having weak chemical resistance is formed after the formation of the lower source electrode 7a and the lower drain electrode 8a, and further, the ITO film that is the crystallized oxide translucent conductive film is used for the lower source electrode 7a and the lower drain electrode 8a. According to this structure, the semiconductor film 12 that is the oxide semiconductor film can selectively be etched. In addition, the semiconductor film 12 and the lower source electrode 7a as well as the lower drain electrode 8a, which are made of oxide, are brought into contact with each other, whereby the semiconductor film 12 and the lower source electrode 7a, and the semiconductor film 12 and the lower drain electrode 8a are electrically connected. Accordingly, the interface reaction (oxidation-reduction reaction) of these components can be prevented, and the interface resistance can be suppressed low.

After the formation of the semiconductor film 12, the protection insulating film 14 is formed to cover the semiconductor film 12 that is the oxide semiconductor film, and the semiconductor film 12 and the upper source electrode 7b as well as the upper drain electrode 8b are electrically connected through the contact holes 15 and 17 formed on the protection insulating film 14. Specifically, the source electrode 7 and the drain electrode 8 are electrically connected to both the upper and lower surfaces of the semiconductor film 12. Accordingly, even if the interface resistance between the semiconductor film 12 and the source electrode 7 or the drain electrode 8 is defective on one of the surfaces of the semiconductor film 12, such defect can be compensated on the other surface. Consequently, the interface resistance can further be reduced, and the occurrence of defect caused by characteristic defect of the TFT 201 can be prevented.

In addition, the source line 9 includes two layers that are the lower source line 9a and the upper source line 9b, in which the lower source line 9a and the upper source line 9b are electrically connected by the plurality of contact holes 16 formed on the protection insulating film 14 with a predetermined interval. Therefore, even if disconnection occurs on one of two layers, this can be compensated by the other one. Accordingly, the generation of defect caused by the disconnection of the source line 9 can be prevented.

As described above, according to the present preferred embodiment, the interface resistance between the semiconductor film 12 and the source electrode 7 as well as the drain electrode 8 can be suppressed low, and the generation of defect caused by the pattern failures of the lines can effectively be prevented, even when an oxide semiconductor is used as the semiconductor film 12 (channel layer) in the TFT 201. Since the oxide semiconductor having high mobility is used for the semiconductor film 12 in the TFT 201, the TFT substrate 200 having high operation speed and a display device using the same can be manufactured with high yield. In other words, a high-performance TFT substrate and a liquid crystal display can be manufactured with good productivity.

Second Preferred Embodiment

Figure 8:
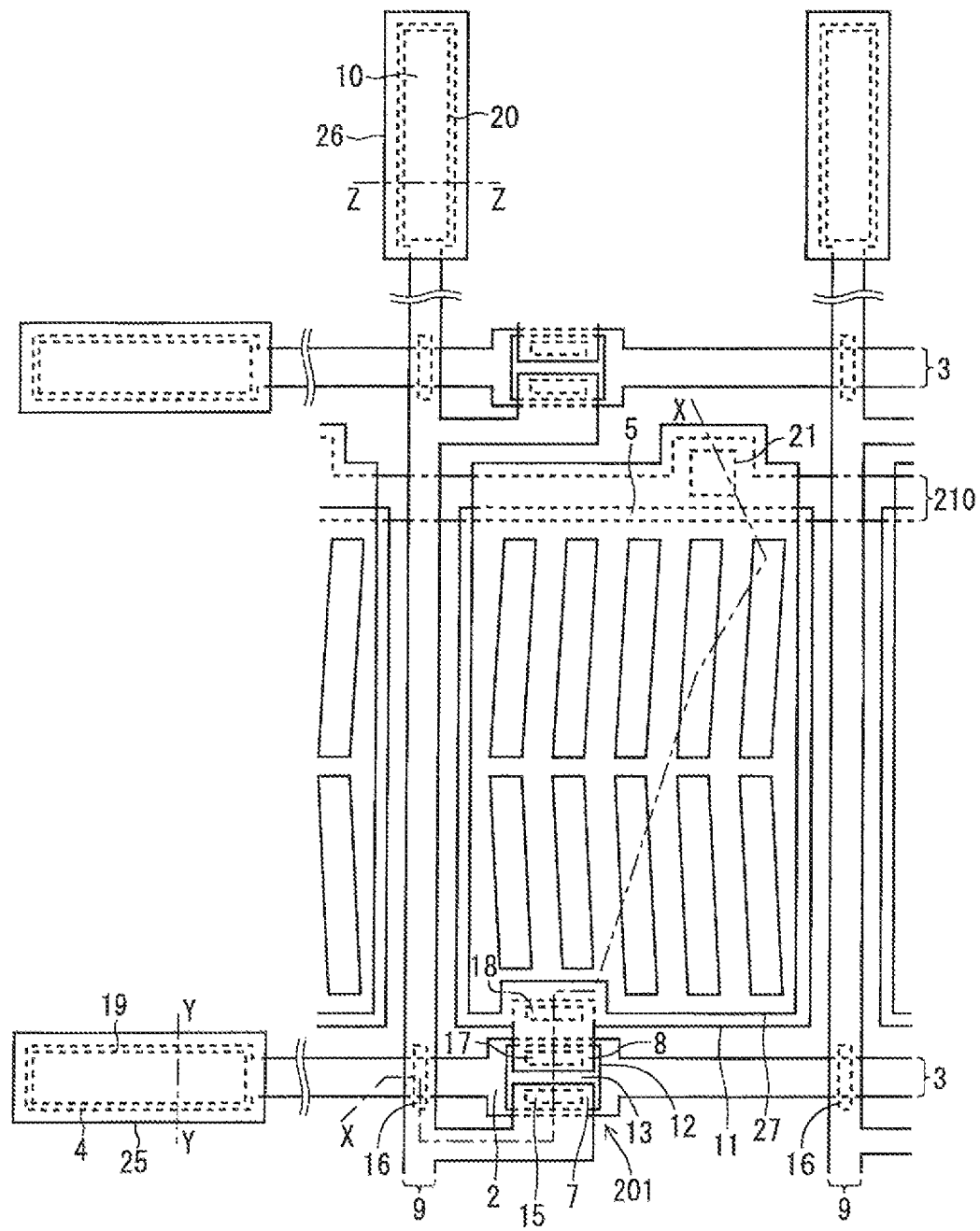
FIG. 8 is a view illustrating a planar configuration of a pixel of a TFT substrate according to a second preferred embodiment.
Figure 9:
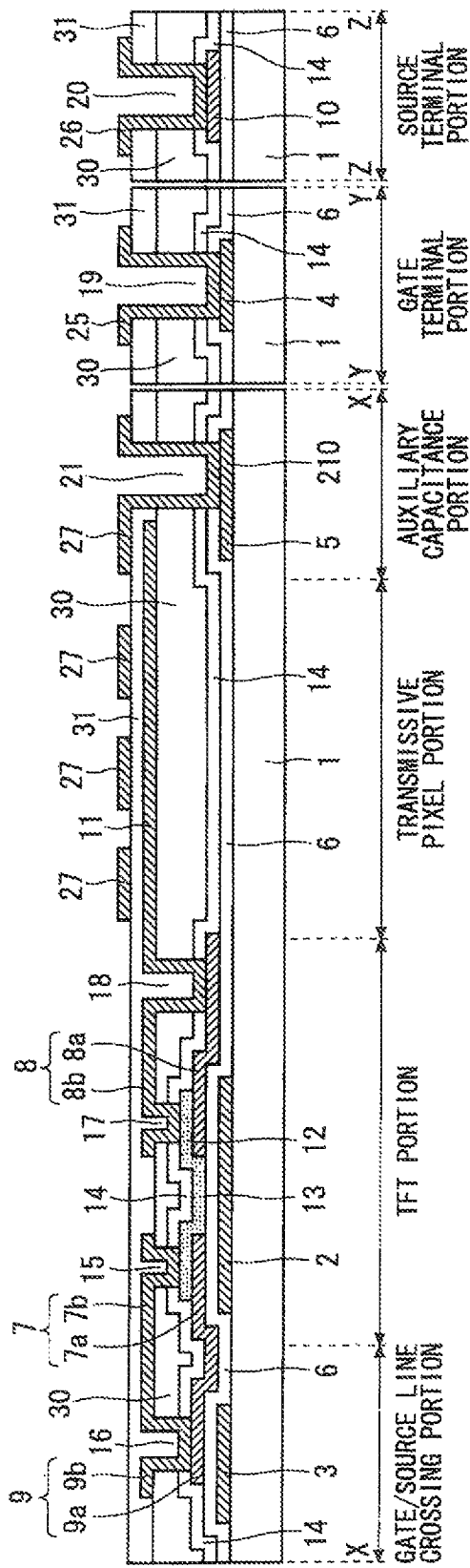
FIG. 9 is a view illustrating a sectional configuration of the pixel of the TFT substrate according to the second preferred embodiment.

FIGS. 8 and 9 are views illustrating a configuration of a TFT substrate 200 according to a second preferred embodiment. In these drawings, the components same as those in FIGS. 2 and 3 are identified by the same numerals.

FIG. 8 is a view illustrating a planar configuration of an essential part including a pixel 204 on the TFT substrate 200 using the FFS system, and FIG. 9 is a view illustrating its sectional configuration. FIG. 9 illustrates the sections corresponding to X-X line, Y-Y line, and Z-Z line in FIG. 8.

The section along X-X line corresponds to a formation region of the pixel 204 (pixel portion). The section along Y-Y line corresponds to a formation region of a gate terminal 4 and a gate terminal pad 25 (gate terminal portion), and the section along Z-Z line corresponds to a formation region of a source terminal 10 and a source terminal pad 26 (source terminal portion). In addition, the section of the pixel portion along X-X line includes a "gate/source line crossing portion" where a gate line 3 and a source line 9 cross each other, a "TFT portion" that is a formation region of the TFT 201, a "transmissive pixel portion" that is a formation region of a pixel electrode 11 and a common electrode 27, and an "auxiliary capacitance portion" that is a formation region of auxiliary capacitance 209.

As illustrated in FIG. 9, the TFT substrate 200 is formed by using a substrate 1 that is a transparent insulating substrate made of a glass, for example. The gate line 3, a gate electrode 2, an auxiliary capacitance electrode 5, an auxiliary capacitance line 210, and the gate terminal 4 are formed on the substrate 1. A gate insulating film 6 is formed to cover these components.

In FIG. 8, the gate line 3 extends in the horizontal direction. The gate electrode 2 on the TFT 201 is a part of the gate line 3. Specifically, the portion of the gate line 3 on the TFT portion serves as the gate electrode 2. The gate electrode 2 has a width larger than that of the other portion of the gate line 3. The gate terminal 4 is formed on one end of the gate line 3. The auxiliary capacitance line 210 extends parallel to the gate line 3, and a part thereof serves as the auxiliary capacitance electrode 5.

As illustrated in FIG. 9, on the TFT substrate 200 according to the present preferred embodiment, each of the source line 9, a source electrode 7, and a drain electrode 8 includes two layers, which are upper and lower layers, sandwiching a protection insulating films 14 and 30. Specifically, the source line 9 includes a lower source line 9a and an upper source line 9b, the source electrode 7 includes a lower source electrode 7a and an upper source electrode 7b, and the drain electrode 8 includes a lower drain electrode 8a and an upper drain electrode 8b.

The lower source line 9a, the lower source electrode 7a, the lower drain electrode 8a, and the source terminal 10 are formed on the gate insulating film 6. The lower source electrode 7a and the lower drain electrode 8a are formed to be superimposed on the gate electrode 2, but are arranged to be separated from each other. A channel region of the TFT 201 is formed on the region between the lower source electrode 7a and the lower drain electrode 8a.

In FIG. 8, the source line 9 (the lower source line 9a and the upper source line 9b) extends in the longitudinal direction. The lower source electrode 7a is formed to be connected to the lower source line 9a. Specifically, the portion branched from the lower source line 9a and extending to the TFT portion serves as the lower source electrode 7a.

A semiconductor film 12 is formed to extend over the lower source electrode 7a and the lower drain electrode 8a (i.e., the semiconductor film 12 is also formed on the region between the lower source electrode 7a and the lower drain electrode 8a). The lower surface of the semiconductor film 12 is in contact with the lower source electrode 7a and the lower drain electrode 8a, whereby the lower source electrode 7a and the lower drain electrode 8a are both electrically connected to the semiconductor film 12. The semiconductor film 12 is formed in an island shape, and the portion located between the lower source electrode 7a and the lower drain electrode 8a serves as the channel region 13.

In the present preferred embodiment, an oxide semiconductor is used as the semiconductor film 12. More specifically, examples of a usable oxide semiconductor include an oxide semiconductor of zinc oxide (ZnO), and an InGaZnO oxide semiconductor formed by adding gallium oxide ($Ga_2O_3$) and indium oxide ($In_2O_3$) to zinc oxide (ZnO). Since the channel region 13 of the semiconductor film 12 is made of the oxide semiconductor, mobility higher than that of a semiconductor film using amorphous silicon can be realized.

The protection insulating film 14 is formed on the entire upper surface of the substrate 1 so as to cover the semiconductor film 12, the lower source line 9a, the lower source electrode 7a, the lower drain electrode 8a, and the source terminal 10. In the present preferred embodiment, the protection insulating film 30 is stacked on the protection insulating film 14, and the channel region 13 of the TFT 201 is protected by these protection insulating films 14 and 30. The upper protection insulating film 30 is made of an organic resin film, and this film flattens the upper surface of the substrate 1. The protection insulating film 30 is referred to as a "flattening film" hereinbelow.

A plurality of contact holes are formed on the protection insulating film 14 and the flattening film 30. Specifically, the plurality of contact holes include a contact hole 16 reaching the lower source line 9a, contact holes 15 and 17 reaching the semiconductor film 12, and a contact hole 18 reaching the lower drain electrode 8a.

The contact hole 15 is formed on the position where it is superimposed on the lower source electrode 7a, and the contact hole 17 is formed on the position where it is superimposed on the lower drain electrode 8a. Accordingly, the contact holes 15 and 17 are formed on the positions where they are not superimposed on the channel region 13. The contact holes 16 are formed along the source line 9 with a constant interval as illustrated in FIG. 8.

The upper source line 9b, the upper source electrode 7b, the upper drain electrode 8b, and the pixel electrode 11 are formed on the flattening film 30.

The upper source electrode 7b is formed to be connected to the upper source line 9b. Specifically, the portion branched from the upper source line 9b and extending to the TFT portion serves as the upper source electrode 7a. The upper source line 9b is in contact with the lower source line 9a through the contact hole 16, whereby the lower source line 9a and the upper source line 9b are electrically connected. The upper source electrode 7b is in contact with the semiconductor film 12 above the lower source electrode 7a through the contact hole 15, whereby the semiconductor film 12 and the upper source electrode 7b are electrically connected. Accordingly, the semiconductor film 12 and the source line 9 are electrically connected through the lower source electrode 7a, and electrically connected through the upper source electrode 7b.

The upper drain electrode 8b is in contact with the semiconductor film 12 above the lower drain electrode 8a through the contact hole 17, whereby the semiconductor film 12 and the upper drain electrode 8b are electrically connected. The upper drain electrode 8b is also in contact with the lower drain electrode 8a through the contact hole 18, whereby the lower drain electrode 8a and the upper drain electrode 8b are electrically connected.

The pixel electrode 11 is a plate electrode, and it is formed to be connected to the upper drain electrode 8b. Specifically, the portion of the pixel electrode 11 superimposed on the gate electrode 2 serves as the upper drain electrode 8b. Since the upper drain electrode 8b is electrically connected to the lower drain electrode 8a, the semiconductor film 12 and the pixel electrode 11 are electrically connected through the lower drain electrode 8a, and also electrically connected through the upper drain electrode 8b. In addition, the pixel electrode 11 is locally superimposed on the auxiliary capacitance electrode 5 through the gate insulating film 6, the protection insulating film 14, and the flattening film 30, and the auxiliary capacitance 209 is formed on this portion. In the transmissive liquid crystal display, the pixel electrode 11 is made of a translucent conductive film.

An interlayer insulating film 31 is formed on the entire upper surface of the substrate 1 to cover the upper source line 9b, the upper source electrode 7b, the upper drain electrode 8b, and the pixel electrode 11. Contact holes including a contact hole 21 reaching the auxiliary capacitance line 210, a contact hole 19 reaching the gate terminal 4, and a contact hole 20 reaching the source terminal 10 are formed on the interlayer insulating film 31 (the contact hole 20 penetrates the interlayer insulating film 31, the flattening film 30, and the protection insulating film 14, and the contact holes 19 and 21 penetrate even the gate insulating film 6).

The common electrode 27, the gate terminal pad 25, and the source terminal pad 26 are formed on the interlayer insulating film 31.

As illustrated in FIG. 8, the common electrode 27 is an interdigital electrode having a slit, and is arranged opposite to the pixel electrode 11 via the interlayer insulating film 31. The common electrode 27 is in contact with the auxiliary capacitance line 210 through the contact hole 21, whereby the common electrode 27 and the auxiliary capacitance line 210 are electrically connected.

The gate terminal pad 25 is in contact with the gate terminal 4 through the contact hole 19, whereby the gate terminal pad 25 and the gate terminal 4 are electrically connected. The source terminal pad 26 is in contact with the source terminal 10 through the contact hole 20, whereby the gate terminal pad 25 and the source terminal 10 are electrically connected.

Subsequently, a manufacturing method of the TFT substrate 200 according to the second preferred embodiment will be described with reference to FIGS. 10 to 15. The components in FIGS. 10 to 15 corresponding to the components in FIG. 9 are identified by the same numerals.

Firstly, the substrate 1 is cleaned with cleaning liquid or pure water. In the present preferred embodiment, a glass substrate with a thickness of 0.5 mm is used as the substrate 1. Then, a first conductive film that is a material of the gate electrode 2 and the gate line 3 is formed on the entire main surface of the cleaned substrate 1.

Examples of usable first conductive film include chrome (Cr), molybdenum (Mo), titanium (Ti), copper (Cu), tantalum (Ta), tungsten (W), aluminum (Al), and an alloy formed by adding a small amount of other elements to these metals. The first conductive film may have a stacked structure including two or more layers made of these metals or alloy. A low-resistance conductive film having a specific resistance value of not more than 50 μΩcm can be formed by using these metals or alloy.

In the present preferred embodiment, an Mo film is used as the first conductive film, and this Mo film is subjected to film formation to have a thickness of 200 nm by a sputtering method using Ar gas. Thereafter, a photoresist material is applied on the Mo film to form a photoresist pattern by the first photolithography process, and then, the Mo film is patterned by an etching process with the photoresist pattern being used as a mask. In this preferred embodiment, wet etching using a solution (PAN chemical) containing phosphoric acid, acetic acid, and nitric acid is performed.

Figure 10:
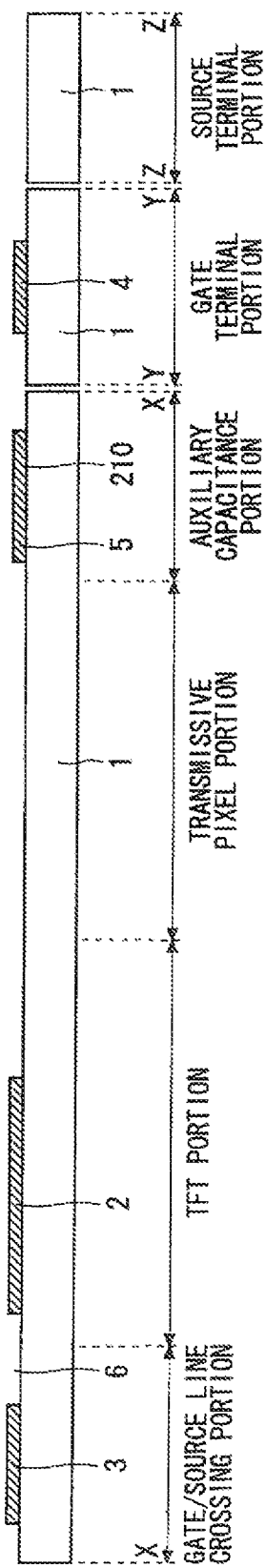
FIGS. 10 to 15 are sectional views illustrating a manufacturing process of the TFT substrate according to the second preferred embodiment.

Thereafter, the photoresist pattern is removed. As a result, the gate line 3, the gate electrode 2, the auxiliary capacitance electrode 5, the auxiliary capacitance line 210, and the gate terminal 4 are formed on the substrate 1 as illustrated in FIG. 10.

Next, the gate insulating film 6 is formed on the entire upper surface of the substrate 1. In the present preferred embodiment, an oxide silicon film (SiO) serving as the gate insulating film 6 is formed by using a chemical vapor deposition (CVD) method. In the present preferred embodiment, the oxide silicon film with a thickness of 300 nm is formed under a substrate heating condition of about 300° C. Since the oxide silicon film has low barrier property (blocking property) to impurity elements affecting the TFT characteristic, such as water content ($H_2O$), hydrogen ($H_2$), sodium (Na), and potassium (K), the gate insulating film 6 may have a stacked structure including a nitride silicon film (SiN), which has excellent barrier property, as a lower layer of the oxide silicon film, for example.

Thereafter, a second conductive film that is a material for the lower source electrode 7a and the lower drain electrode 8a is formed on the gate insulating film 6. In the present preferred embodiment, a translucent conductive film is used as the second conductive film. Examples of usable second conductive film include chrome (Cr), molybdenum (Mo), titanium (Ti), copper (Cu), tantalum (Ta), tungsten (W), aluminum (Al), and an alloy formed by adding a small amount of other elements to these metals. The second conductive film may have a stacked structure including two or more layers made of these metals or alloy. A low-resistance conductive film having a specific resistance value of not more than 50 μΩcm can be formed by using these metals or alloy.

In the present preferred embodiment, an ITO film (a mixture ratio of indium oxide $In_2O_3$ and tin oxide $SnO_2$ is 90:10 (wt %), for example) is used as the second conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the second photolithography process, and the amorphous ITO film is etched by using the photoresist pattern as a mask. Wet etching using an oxalic acid solution can be used for this etching process.

Figure 11:
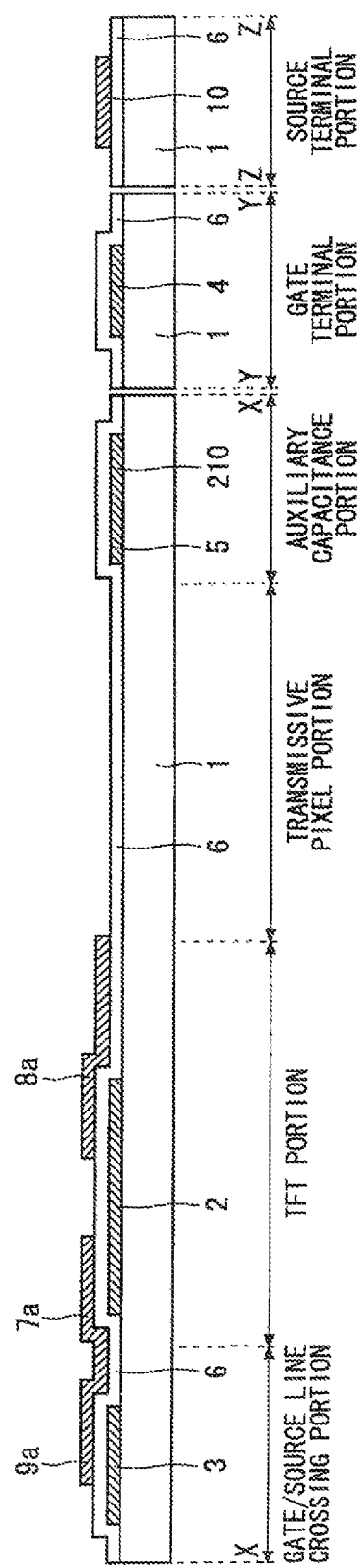

Thereafter, the photoresist pattern is removed. As a result, the lower source line 9a, the lower source electrode 7a, the lower drain electrode 8a, and the source terminal 10 are formed as illustrated in FIG. 11.

Then, the substrate 1 is heated at a temperature of 200° C. According to this heat treatment, the ITO film in the amorphous state is crystallized to become a polycrystalline ITO film. Since the ITO film in a polycrystalline state has excellent chemical stability, and is not dissolved into general etching chemical (containing oxalic acid) except for aqua regia (hydrochloric acid+nitric acid), etching selectivity with a metal film formed thereon in the subsequent process can be assured. The temperature in the heat treatment for crystallizing the amorphous ITO film has to be higher than at least a temperature (crystallization temperature) at which the crystallization of the amorphous ITO film is started. The crystallization temperature of an amorphous ITO film having a general composition is about 150° C.

Next, an oxide semiconductor that is a material for the semiconductor film 12 is formed. In the present preferred embodiment, an oxide (InGaZnO) containing In, Ga, and Zn is used as the oxide semiconductor. Here, an InGaZnO target having an atomic composition ratio of In:Ga:Zn:O is 1:1:1:4 is used, and the oxide semiconductor (InGaZnO film) is formed by a sputtering method using Ar gas.

In this case, the atomic composition ratio of oxygen is less than a stoichiometric composition, so that an oxide film with insufficient oxygen ion (in the example described above, the composition ratio of O is less than 4) is generally formed. Therefore, it is preferable that the sputtering is performed by adding oxygen gas ($O_2$) to Ar gas. In the present preferred embodiment, the InGaZnO film with a thickness of 50 nm is formed with the sputtering using a mixed gas formed by adding $O_2$ gas of 10% in a partial pressure percent to Ar gas. The InGaZnO film is formed to have an amorphous structure. The crystallization temperature of the InGaZnO film having the amorphous structure is generally 500° C. or higher, so that the most part in the film keeps the amorphous structure and is stabilized in this state at room temperature.

Figure 12:
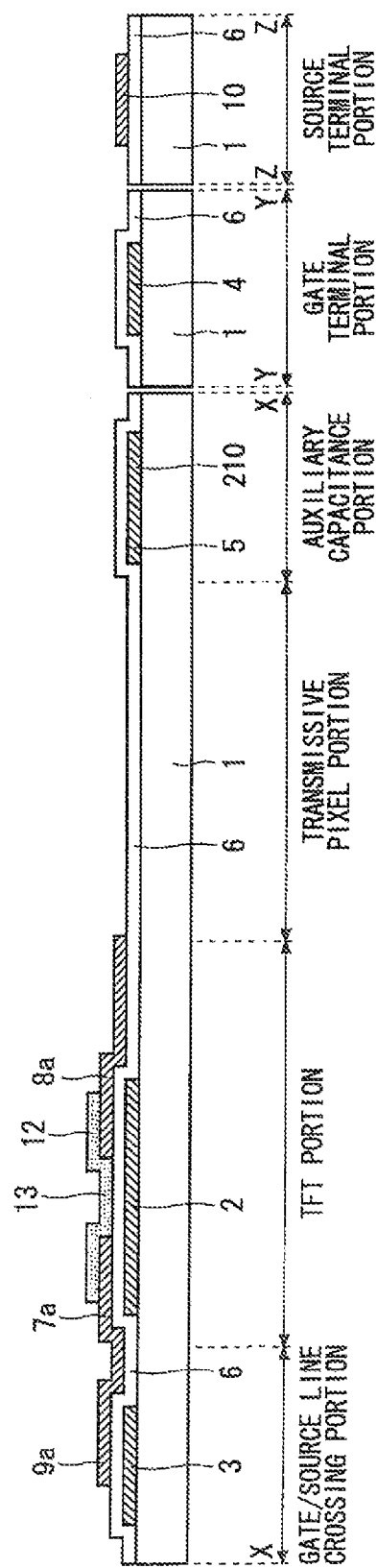

Next, a photoresist pattern is formed by the third photolithography process, and the InGaZnO film is etched by using this pattern as a mask. Thereafter, the photoresist pattern is removed. As a result, the semiconductor film 12 extending over the lower source electrode 7a and the lower drain electrode 8a is formed as illustrated in FIG. 12.

During the etching process of the InGaZnO film having the amorphous structure, wet etching using an oxalic acid solution can be employed. The lower source line 9a, the lower source electrode 7a, the lower drain electrode 8a, and the source terminal 10, which are formed in the previous process, are the crystallized ITO film, and they are not etched by the oxalic acid solution. Therefore, these patterns are not eliminated.

The semiconductor film 12 made of the oxide semiconductor (InGaZnO film) is brought into contact with the lower source electrode 7a and the upper source electrode 7b made of ITO that is also the oxide in order to electrically connect the semiconductor film 12 and the lower and upper source electrodes 7a and 7b. According to this configuration, the interface reaction (oxidation-reduction reaction) between the semiconductor film 12 and the lower and upper source electrodes 7a and 7b is prevented. Accordingly, the contact resistance (interface resistance) between the semiconductor film 12 and the lower and upper source electrodes 7a and 7b can be suppressed low. Consequently, on current and mobility of the TFT 201 can be increased, whereby an effect of enhancing the TFT characteristic can be obtained.

After the semiconductor film 12 is formed, the protection insulating film 14 and the flattening film 30 are formed on the entire upper surface of the substrate 1. In the present preferred embodiment, an oxide silicon (SiO) film with a thickness of 100 nm is formed by using a chemical vapor deposition (CVD) method under the substrate heating condition of about 250° C. to form the protection insulating film 14. In addition, the flattening film 30 is formed by applying an organic resin.

A photoresist pattern is then formed by the fourth photolithography process, and the flattening film 30 and the protection insulating film 14 are etched by using this pattern as a mask, whereby the contact holes 15 to 18 are simultaneously formed. A dry etching process using fluorine gas can be used for this etching process.

Figure 13:
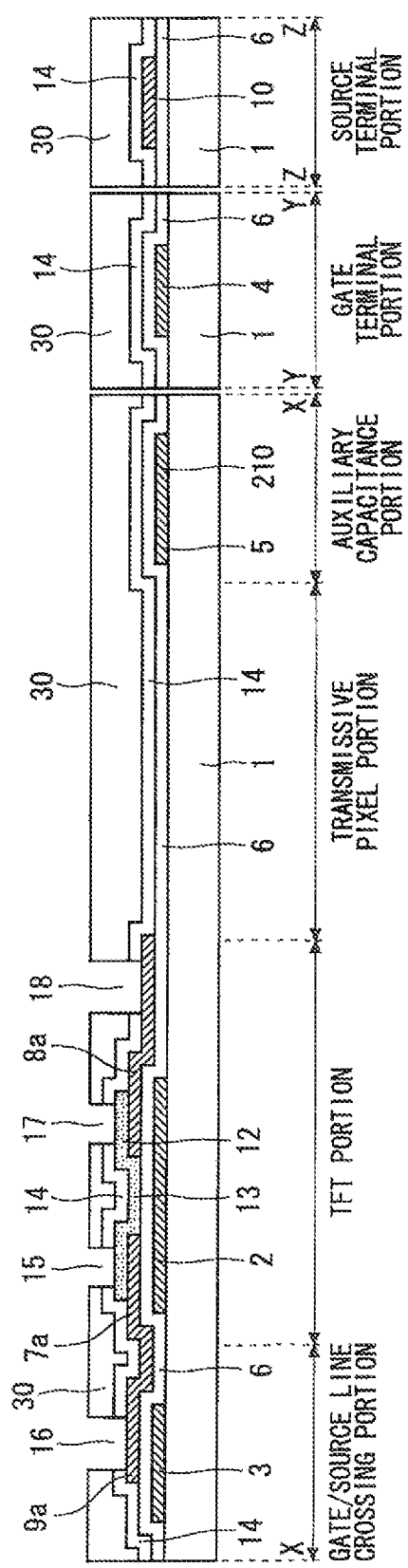

Thereafter, the photoresist pattern is removed. As a result, the contact hole 16 reaching the lower source line 9a and the contact holes 15 and 17 reaching the semiconductor film 12 are formed as illustrated in FIG. 13.

In the present preferred embodiment, the protection insulating film 14 is the oxide silicon film. However, the protection insulating film 14 may have a stacked structure including a nitride silicon film, which has excellent barrier property, as an upper layer of the oxide silicon film, for example, since the oxide silicon film has low barrier property (blocking property) to impurity elements affecting the TFT characteristic, such as water content ($H_2O$), hydrogen ($H_2$), sodium (Na), and potassium (K). Alternatively, the protection insulating film 14 may have a single-layer structure of a silicon nitride film.

When the silicon nitride is used for the protection insulating film 14, a wedge might be formed during the formation of the contact hole reaching the surface of the translucent conductive film by the dry etching using fluorine gas, and this wedge might cause an electrical connection failure. The effective structure for preventing the generation of the wedge is such that the protection insulating film 14 is formed to have a stacked structure having at least two layers including an upper silicon nitride film and a lower silicon nitride film, in which the lower silicon nitride film is formed to have a smaller absolute value of a film stress than the upper silicon nitride film. Specifically, the absolute value of the film stress of the lower silicon nitride film is preferably set in the range of 150 MPa to 200 MPa. When the N/Si ratio of the silicon nitride film is increased, the absolute value of the film stress can be decreased, but the N/Si ratio of the upper silicon nitride film is desirably in the range of 1.1 to 1.5. Alternatively, it is also effective that the protection insulating film 14 is formed to have a single-layer structure of a silicon nitride film having a small absolute value of a film stress.

Since the generation of the wedge is prevented, stress is balanced during the formation of the protection insulating film 14, whereby the film-forming condition that makes it difficult to generate the film floating is easy to be employed. Consequently, the film floating of the protection insulating film 14 can be prevented.

Thereafter, a third conductive film that is the material for the upper source electrode 7b, the upper drain electrode 8b, and the pixel electrode 11 is formed. In the present preferred embodiment, a translucent conductive film is formed as the third conductive film. An ITO film (a mixture ratio of indium oxide $In_2O_3$ and tin oxide $SnO_2$ is 90:10 (wt %), for example) is used as the translucent conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the fifth photolithography process, and the amorphous ITO film is etched by using the photoresist pattern as a mask. Wet etching using a solution containing phosphoric acid+nitric acid+acetic acid is used for this etching process. In this case, since the semiconductor film 12 made of the oxide semiconductor formed in the previous process is covered by the protection insulating film 14, the pattern of the semiconductor film 12 is not eliminated by the etching for the translucent conductive film, whereby the selective etching can be carried out.

Figure 14:
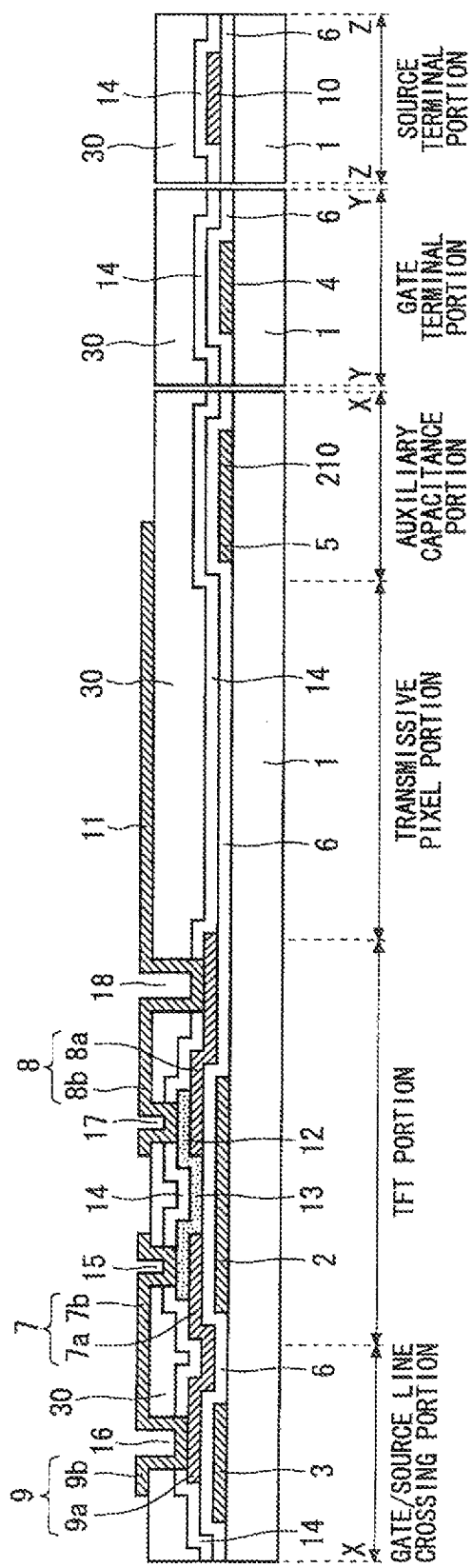

Thereafter, the photoresist pattern is removed. As a result, the upper source line 9b, the upper source electrode 7b, the upper drain electrode 8b, and the pixel electrode 11 are formed as illustrated in FIG. 14.

Next, an oxide silicon film (SiO) serving as the interlayer insulating film 31 is formed with the chemical vapor deposition (CVD) method. In the present preferred embodiment, the oxide silicon film with a thickness of 300 nm is formed under a substrate heating condition of about 300° C. Since the oxide silicon film has low barrier property (blocking property) to impurity elements affecting the TFT characteristic, such as water content ($H_2O$), hydrogen ($H_2$), sodium (Na), and potassium (K), the interlayer insulating film 31 may have a stacked structure including a nitride silicon film (SiN), which has excellent barrier property, as a lower layer of the oxide silicon film, for example.

A photoresist pattern is then formed by the sixth photolithography process, and the interlayer insulating film 31, the flattening film 30, the protection insulating film 14, and the gate insulating film 6 are etched by using this pattern as a mask, whereby the contact holes 19 to 21 are simultaneously formed. A dry etching process using fluorine gas can be used for this etching process.

Figure 15:
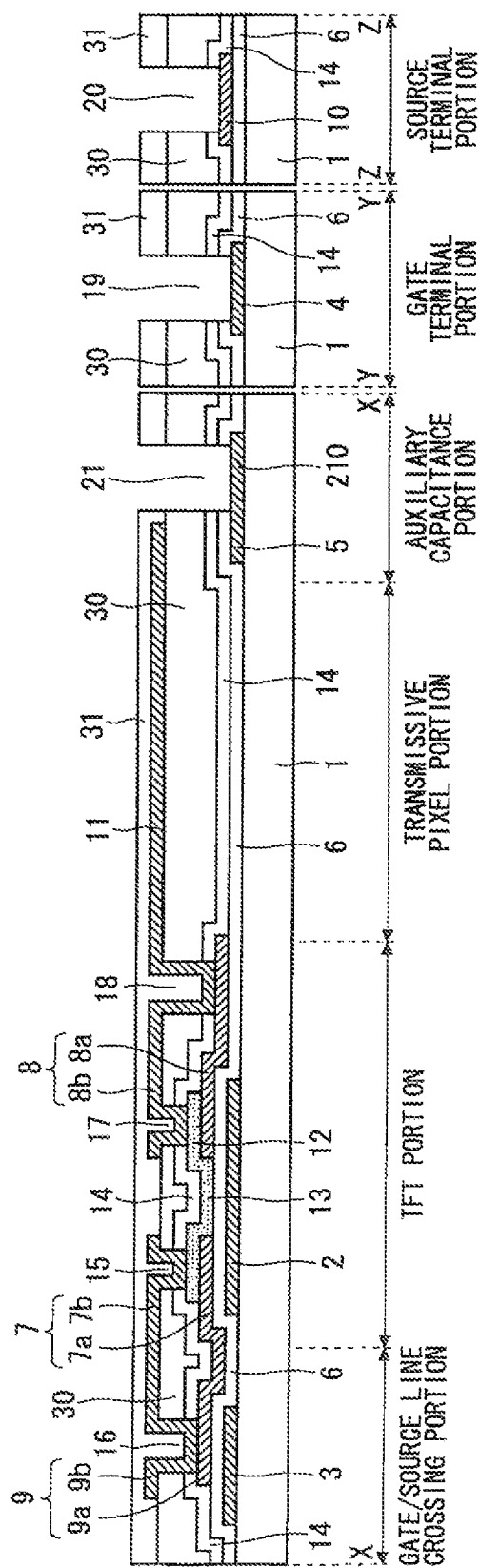

Thereafter, the photoresist pattern is removed. As a result, the contact hole 21 reaching the auxiliary capacitance line 210, the contact hole 19 reaching the gate terminal 4, and the contact hole 20 reaching the source terminal 10 are formed as illustrated in FIG. 15.

Thereafter, a fourth conductive film that is the material for the common electrode 27, the gate terminal pad 25, and the source terminal pad 26 is formed. In the present preferred embodiment, a translucent conductive film is formed as the fourth conductive film. An ITO film (a mixture ratio of indium oxide $In_2O_3$ and tin oxide $SnO_2$ is 90:10 (wt %), for example) is used for the translucent conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the seventh photolithography process, and the amorphous ITO film is etched by using the photoresist pattern as a mask. Wet etching using a solution containing phosphoric acid+nitric acid+acetic acid is used for this etching process.

Thereafter, the photoresist pattern is removed. As a result, the common electrode 27, the gate terminal pad 25, and the source terminal pad 26 are formed. Thus, the structure illustrated in FIG. 9 is completed.

As described above, in the second preferred embodiment, the high-performance TFT substrate 200 in which the oxide semiconductor is used for the semiconductor film 12 in the TFT 201 can be formed by seven photolithography processes.

Upon assembling the liquid crystal display panel, an orientation film and a spacer are formed on the surface of the completed TFT substrate 200. The orientation film is a film for arraying the liquid crystal, and it is made of polyimide. A counter substrate that is separately formed to have a color filter or an orientation film is adhered to the TFT substrate 200. In this case, a gap is formed between the TFT substrate 200 and the counter substrate by the spacer. The liquid crystal fills this gap, whereby the liquid crystal display panel is completed. Finally, a polarizing plate, a wave plate, and a backlight unit are arranged outside the liquid crystal display panel. Thus, a liquid crystal display is completed.

In the present preferred embodiment, the semiconductor film 12 made of an oxide semiconductor having weak chemical resistance is formed after the formation of the lower source electrode 7a and the lower drain electrode 8a, and further, the ITO film that is the crystallized oxide translucent conductive film is used for the lower source electrode 7a and the lower drain electrode 8a. According to this structure, the semiconductor film 12 that is the oxide semiconductor film can selectively be etched. In addition, the semiconductor film 12 and the lower source electrode 7a as well as the lower drain electrode 8a, which are made of oxide, are brought into contact with each other, whereby the semiconductor film 12 and the lower source electrode 7a, and the semiconductor film 12 and the lower drain electrode 8a are electrically connected. Accordingly, the interface reaction (oxidation-reduction reaction) of these components can be prevented, and the interface resistance can be suppressed low.

After the formation of the semiconductor film 12, the protection insulating film 14 and the flattening film 30 are formed to cover the semiconductor film 12 that is the oxide semiconductor film, and the semiconductor film 12 and the upper source electrode 7b as well as the upper drain electrode 8b are electrically connected through the contact holes 15 and 17 formed on the protection insulating film 14 and the flattening film 30. Specifically, the source electrode 7 and the drain electrode 8 are electrically connected to both the upper and lower surfaces of the semiconductor film 12. Accordingly, even if the interface resistance between the semiconductor film 12 and the source electrode 7 or the drain electrode 8 is defective on one of the surfaces of the semiconductor film 12, such defect can be compensated on the other surface. Consequently, the interface resistance can further be reduced, and the occurrence of defect caused by characteristic defect of the TFT 201 can be prevented.

In addition, the source line 9 includes two layers that are the lower source line 9a and the upper source line 9b, in which the lower source line 9a and the upper source line 9b are electrically connected by the plurality of contact holes 16 formed on the protection insulating film 14 and the flattening film 30 with a predetermined interval. Therefore, even if disconnection occurs on one of two layers, this can be compensated by the other one. Accordingly, the generation of defect caused by the disconnection of the source line 9 can be prevented.

As described above, according to the present preferred embodiment, the interface resistance between the semiconductor film 12 and the source electrode 7 as well as the drain electrode 8 can be suppressed low, and the generation of defect caused by the pattern failures of the lines can effectively be prevented, even when an oxide semiconductor is used as the semiconductor film 12 (channel layer) in the TFT 201. Since the oxide semiconductor having high mobility is used for the semiconductor film 12 in the TFT 201, the TFT substrate 200 having high operation speed and a display device using the same can be manufactured with high yield. In other words, a high-performance TFT substrate and a liquid crystal display can be manufactured with good productivity.

Third Preferred Embodiment

The second preferred embodiment describes the configuration in which the interdigital common electrode having a slit is arranged above the plate-like pixel electrode. However, a configuration in which an interdigital pixel electrode is arranged above a plate-like common electrode may be employed. In a third preferred embodiment, the case where the present invention is applied to a TFT substrate having the latter configuration will be described.

Figure 16:
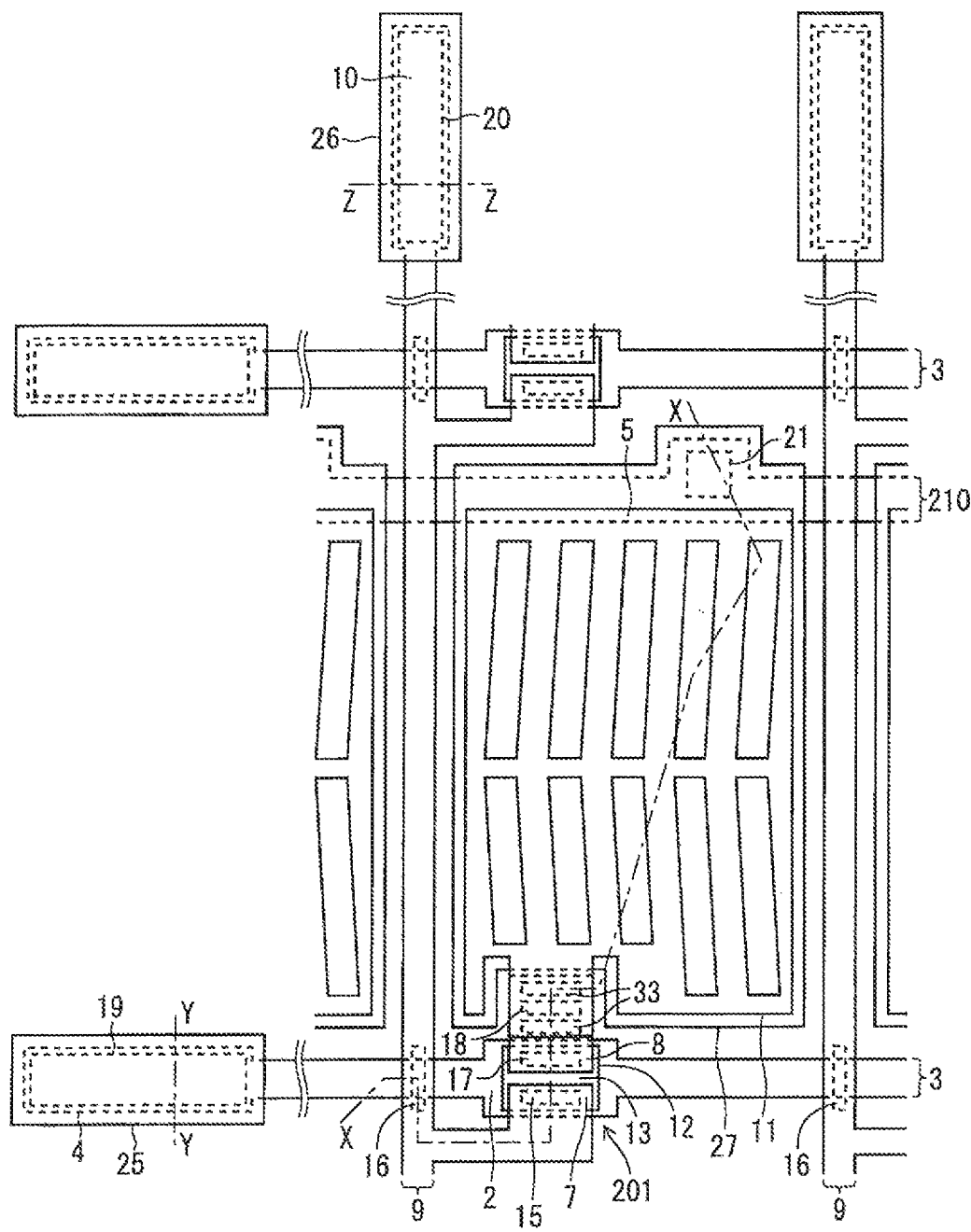
FIG. 16 is a view illustrating a planar configuration of a pixel of a TFT substrate according to a third preferred embodiment.
Figure 17:
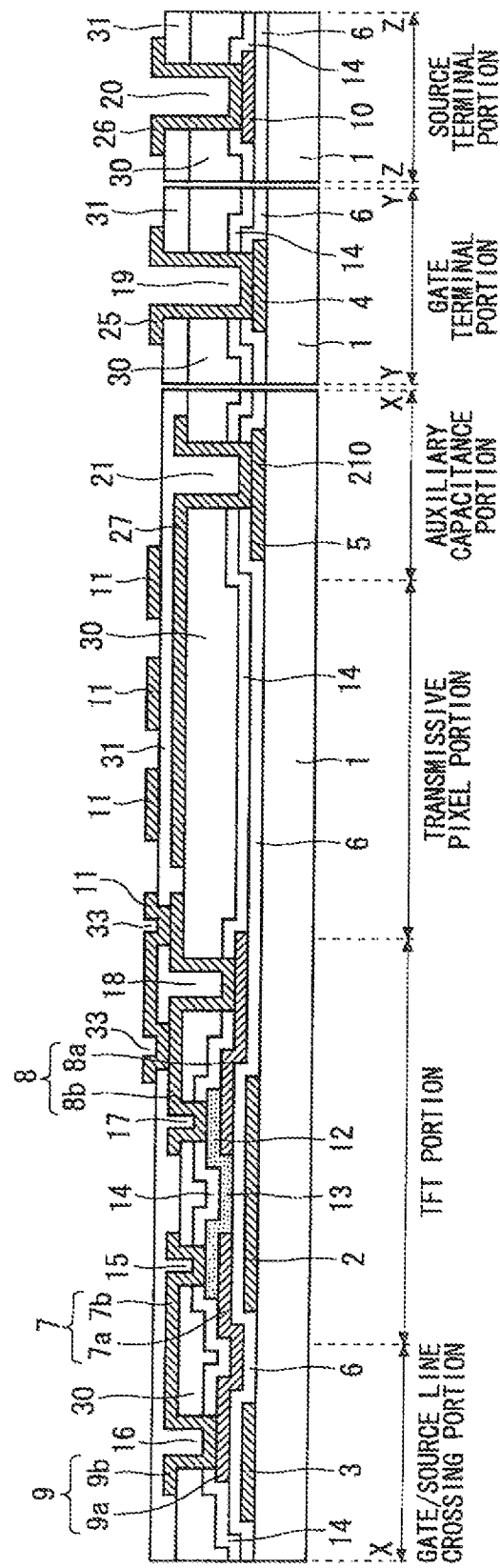
FIG. 17 is a view illustrating a sectional configuration of the pixel of the TFT substrate according to the third preferred embodiment.

FIGS. 16 and 17 are views illustrating a configuration of a TFT substrate 200 according to the third preferred embodiment. In these drawings, the components same as those in FIGS. 2 and 3 are identified by the same numerals.

FIG. 16 is a view illustrating a planar configuration of an essential part including a pixel 204 on the TFT substrate 200 using the FFS system, and FIG. 17 is a view illustrating its sectional configuration. FIG. 17 illustrates the sections corresponding to X-X line, Y-Y line, and Z-Z line in FIG. 16.

The section along X-X line corresponds to a formation region of the pixel 204 (pixel portion). The section along Y-Y line corresponds to a formation region of a gate terminal 4 and a gate terminal pad 25 (gate terminal portion), and the section along Z-Z line corresponds to a formation region of a source terminal 10 and a source terminal pad 26 (source terminal portion). In addition, the section of the pixel portion along X-X line includes a "gate/source line crossing portion" where a gate line 3 and a source line 9 cross each other, a "TFT portion" that is a formation region of the TFT 201, a "transmissive pixel portion" that is a formation region of a pixel electrode 11 and a common electrode 27, and an "auxiliary capacitance portion" that is a formation region of auxiliary capacitance 209.

As illustrated in FIG. 17, the TFT substrate 200 is formed by using a substrate 1 that is a transparent insulating substrate made of a glass, for example. The gate line 3, a gate electrode 2, an auxiliary capacitance electrode 5, an auxiliary capacitance line 210, and the gate terminal 4 are formed on the substrate 1. A gate insulating film 6 is formed to cover these components.

In FIG. 16, the gate line 3 extends in the horizontal direction. The gate electrode 2 on the TFT 201 is a part of the gate line 3. Specifically, the portion of the gate line 3 on the TFT portion serves as the gate electrode 2. The gate electrode 2 has a width larger than that of the other portion of the gate line 3. The gate terminal 4 is formed on one end of the gate line 3. The auxiliary capacitance line 210 extends parallel to the gate line 3, and a part thereof serves as the auxiliary capacitance electrode 5.

As illustrated in FIG. 17, on the TFT substrate 200 according to the present preferred embodiment, each of the source line 9, a source electrode 7, and a drain electrode 8 includes two layers, which are upper and lower layers, sandwiching a protection insulating film 14 and a flattening film 30. Specifically, the source line 9 includes a lower source line 9a and an upper source line 9b, the source electrode 7 includes a lower source electrode 7a and an upper source electrode 7b, and the drain electrode 8 includes a lower drain electrode 8a and an upper drain electrode 8b.

The lower source line 9a, the lower source electrode 7a, the lower drain electrode 8a, and the source terminal 10 are formed on the gate insulating film 6. The lower source electrode 7a and the lower drain electrode 8a are formed to be superimposed on the gate electrode 2, but are arranged to be separated from each other. A channel region of the TFT 201 is formed on the region between the lower source electrode 7a and the lower drain electrode 8a.

In FIG. 16, the source line 9 (the lower source line 9a and the upper source line 9b) extends in the longitudinal direction. The lower source electrode 7a is formed to be connected to the lower source line 9a. Specifically, the portion branched from the lower source line 9a and extending to the TFT portion serves as the lower source electrode 7a.

A semiconductor film 12 is formed to extend over the lower source electrode 7a and the lower drain electrode 8a (i.e., the semiconductor film 12 is also formed on the region between the lower source electrode 7a and the lower drain electrode 8a). The lower surface of the semiconductor film 12 is in contact with the lower source electrode 7a and the lower drain electrode 8a, whereby the lower source electrode 7a and the lower drain electrode 8a are both electrically connected to the semiconductor film 12. The semiconductor film 12 is formed in an island shape, and the portion located between the lower source electrode 7a and the lower drain electrode 8a serves as the channel region 13.

In the present preferred embodiment, an oxide semiconductor is used as the semiconductor film 12. More specifically, examples of a usable oxide semiconductor include an oxide semiconductor of zinc oxide (ZnO), and an InGaZnO oxide semiconductor formed by adding gallium oxide ($Ga_2O_3$) and indium oxide ($In_2O_3$) to zinc oxide (ZnO). Since the channel region 13 of the semiconductor film 12 is made of the oxide semiconductor, mobility higher than that of a semiconductor film using amorphous silicon can be realized.

The protection insulating film 14 and the flattening film 30 are formed on the entire upper surface of the substrate 1 so as to cover the semiconductor film 12, the lower source line 9a, the lower source electrode 7a, the lower drain electrode 8a, and the source terminal 10. The channel region 13 of the TFT 201 is protected by the protection insulating films 14 and 30.

A plurality of contact holes are formed on the protection insulating film 14 and the flattening film 30. Specifically, the plurality of contact holes include a contact hole 16 reaching the lower source line 9a, contact holes 15 and 17 reaching the semiconductor film 12, a contact hole 18 reaching the lower drain electrode 8a, and a contact hole 21 reaching the auxiliary capacitance line 210 (the contact hole 21 penetrates not only the flattening film 30 and the protection insulating film 14 but also the gate insulating film 6).

The contact hole 15 is formed on the position where it is superimposed on the lower source electrode 7a, and the contact hole 17 is formed on the position where it is superimposed on the lower drain electrode 8a. Accordingly, the contact holes 15 and 17 are formed on the positions where they are not superimposed on the channel region 13. The contact holes 16 are formed along the source line 9 with a constant interval as illustrated in FIG. 16.

The upper source line 9b, the upper source electrode 7b, the upper drain electrode 8b, and the common electrode 27 are formed on the flattening film 30.

The upper source electrode 7b is formed to be connected to the upper source line 9b. Specifically, the portion branched from the upper source line 9b and extending to the TFT portion serves as the lower source electrode 7a. The upper source line 9b is in contact with the lower source line 9a through the contact hole 16, whereby the lower source line 9a and the upper source line 9b are electrically connected. The upper source electrode 7b is in contact with the semiconductor film 12 above the lower source electrode 7a through the contact hole 15, whereby the semiconductor film 12 and the upper source electrode 7b are electrically connected. Accordingly, the semiconductor film 12 and the source line 9 are electrically connected through the lower source electrode 7a, and electrically connected through the upper source electrode 7b.

The upper drain electrode 8b is in contact with the semiconductor film 12 above the lower drain electrode 8a through the contact hole 17, whereby the semiconductor film 12 and the upper drain electrode 8b are electrically connected. The upper drain electrode 8b is also in contact with the lower drain electrode 8a through the contact hole 18, whereby the lower drain electrode 8a and the upper drain electrode 8b are electrically connected.

The common electrode 27 is a plate electrode, and it is in contact with the auxiliary capacitance line 210 through the contact hole 21, whereby the common electrode 27 and the auxiliary capacitance line 210 are electrically connected.

An interlayer insulating film 31 is formed on the entire upper surface of the substrate 1 to cover the upper source line 9b, the upper source electrode 7b, the upper drain electrode 8b, and the common electrode 27. Contact holes including a contact hole 33 reaching the upper drain electrode 8b, a contact hole 19 reaching the gate terminal 4, and a contact hole 20 reaching the source terminal 10 are formed on the interlayer insulating film 31 (the contact hole 20 penetrates the interlayer insulating film 31, the flattening film 30, and the protection insulating film 14, and the contact hole 21 penetrates even the gate insulating film 6).

The pixel electrode 11, the gate terminal pad 25, and the source terminal pad 26 are formed on the interlayer insulating film 31.

As illustrated in FIG. 16, the pixel electrode 11 is an interdigital electrode having a slit, and is arranged opposite to the common electrode 27 via the interlayer insulating film 31. The pixel electrode 11 is in contact with the upper drain electrode 8b through the contact hole 33, whereby the pixel electrode 11 and the upper drain electrode 8b are electrically connected. Since the upper drain electrode 8b is electrically connected to the lower drain electrode 8a, the semiconductor film 12 and the pixel electrode 11 are electrically connected through the lower drain electrode 8a, and also electrically connected through the upper drain electrode 8b. In the transmissive liquid crystal display, the pixel electrode 11 is made of a translucent conductive film.

The gate terminal pad 25 is in contact with the gate terminal 4 through the contact hole 19, whereby the gate terminal pad 25 and the gate terminal 4 are electrically connected. The source terminal pad 26 is in contact with the source terminal 10 through the contact hole 20, whereby the gate terminal pad 25 and the source terminal 10 are electrically connected.

Subsequently, a manufacturing method of the TFT substrate 200 according to the third preferred embodiment will be described with reference to FIGS. 18 to 23. The components in FIGS. 18 to 23 corresponding to the components in FIG. 17 are identified by the same numerals.

Firstly, the substrate 1 is cleaned with cleaning liquid or pure water. In the present preferred embodiment, a glass substrate with a thickness of 0.5 mm is used as the substrate 1. Then, a first conductive film that is a material of the gate electrode 2 and the gate line 3 is formed on the entire main surface of the cleaned substrate 1.

Examples of usable first conductive film include chrome (Cr), molybdenum (Mo), titanium (Ti), copper (Cu), tantalum (Ta), tungsten (W), aluminum (Al), and an alloy formed by adding a small amount of other elements to these metals. The first conductive film may have a stacked structure including two or more layers made of these metals or alloy. A low-resistance conductive film having a specific resistance value of not more than 50 μΩcm can be formed by using these metals or alloy.

In the present preferred embodiment, an Mo film is used as the first conductive film, and this Mo film is subjected to film formation to have a thickness of 200 nm by a sputtering method using Ar gas. Thereafter, a photoresist material is applied on the Mo film to form a photoresist pattern by the first photolithography process, and then, the Mo film is patterned by an etching process with the photoresist pattern being used as a mask. In this preferred embodiment, wet etching using a solution (PAN chemical) containing phosphoric acid, acetic acid, and nitric acid is performed.

Figure 18:
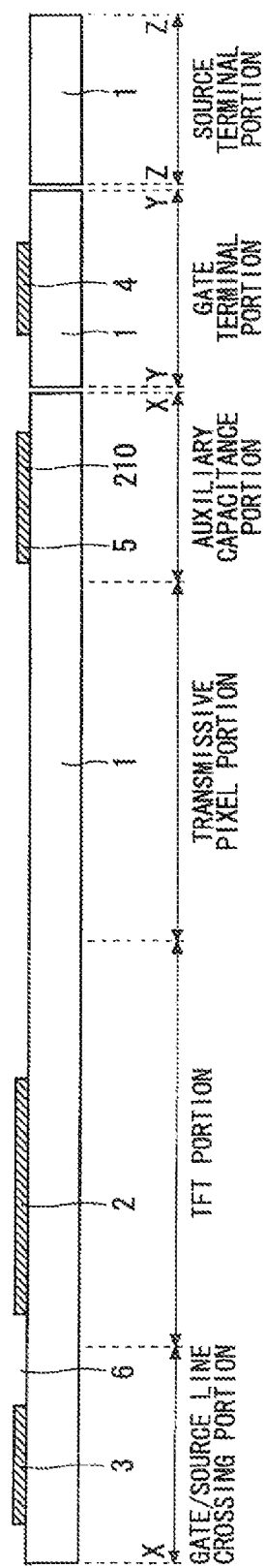

Thereafter, the photoresist pattern is removed. As a result, the gate line 3, the gate electrode 2, the auxiliary capacitance electrode 5, the auxiliary capacitance line 210, and the gate terminal 4 are formed on the substrate 1 as illustrated in FIG. 18.

Next, the gate insulating film 6 is formed on the entire upper surface of the substrate 1. In the present preferred embodiment, an oxide silicon film (SiO) serving as the gate insulating film 6 is formed by using a chemical vapor deposition (CVD) method. In the present preferred embodiment, the oxide silicon film with a thickness of 300 nm is formed under a substrate heating condition of about 300° C. Since the oxide silicon film has low barrier property (blocking property) to impurity elements affecting the TFT characteristic, such as water content ($H_2O$), hydrogen ($H_2$), sodium (Na), and potassium (K), the gate insulating film 6 may have a stacked structure including a nitride silicon film (SiN), which has excellent barrier property, as a lower layer of the oxide silicon film, for example.

Thereafter, a second conductive film that is a material for the lower source electrode 7a and the lower drain electrode 8a is formed on the gate insulating film 6. In the present preferred embodiment, a translucent conductive film is used as the second conductive film. Examples of usable second conductive film include chrome (Cr), molybdenum (Mo), titanium (Ti), copper (Cu), tantalum (Ta), tungsten (W), aluminum (Al), and an alloy formed by adding a small amount of other elements to these metals. The second conductive film may have a stacked structure including two or more layers made of these metals or alloy. A low-resistance conductive film having a specific resistance value of not more than 50 μΩcm can be formed by using these metals or alloy.

In the present preferred embodiment, an ITO film (a mixture ratio of indium oxide $In_2O_3$ and tin oxide $SnO_2$ is 90:10 (wt %), for example) is used as the second conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the second photolithography process, and the amorphous ITO film is etched by using the photoresist pattern as a mask. Wet etching using an oxalic acid solution can be used for this etching process.

Figure 19:
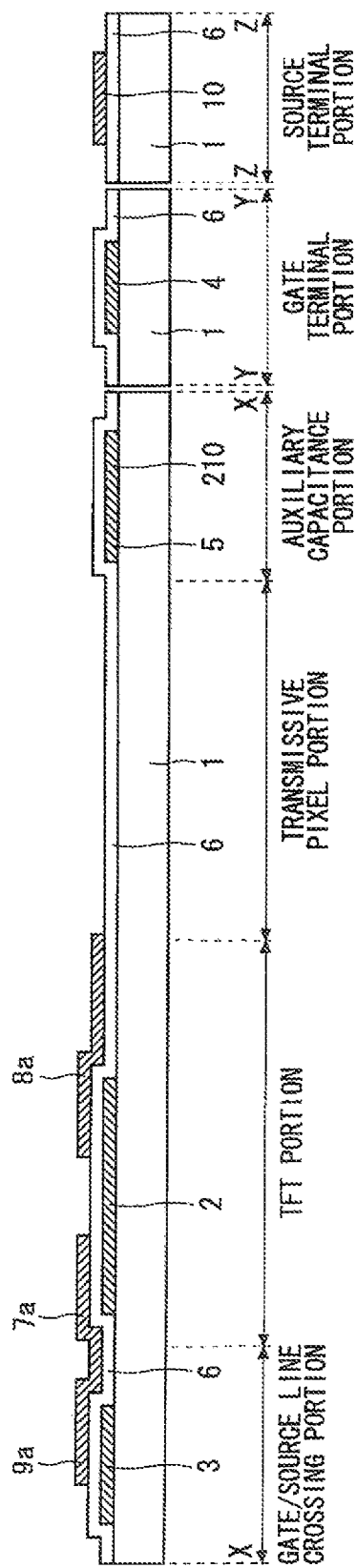

Thereafter, the photoresist pattern is removed. As a result, the lower source line 9a, the lower source electrode 7a, the lower drain electrode 8a, and the source terminal 10 are formed as illustrated in FIG. 19.

Then, the substrate 1 is heated at a temperature of 200° C. According to this heat treatment, the ITO film in the amorphous state is crystallized to become a polycrystalline ITO film. Since the ITO film in a polycrystalline state has excellent chemical stability, and is not dissolved into general etching chemical (containing oxalic acid) except for aqua regia (hydrochloric acid+nitric acid), etching selectivity with a metal film formed thereon in the subsequent process can be assured. The temperature in the heat treatment for crystallizing the amorphous ITO film has to be higher than at least a temperature (crystallization temperature) at which the crystallization of the amorphous ITO film is started. The crystallization temperature of an amorphous ITO film having a general composition is about 150° C.

Next, an oxide semiconductor that is a material for the semiconductor film 12 is formed. In the present preferred embodiment, an oxide (InGaZnO) containing In, Ga, and Zn is used as the oxide semiconductor. Here, an InGaZnO target having an atomic composition ratio of In:Ga:Zn:O is 1:1:1:4 is used, and the oxide semiconductor (InGaZnO film) is formed by a sputtering method using Ar gas.

In this case, the atomic composition ratio of oxygen is less than a stoichiometric composition, so that an oxide film with insufficient oxygen ion (in the example described above, the composition ratio of O is less than 4) is generally formed. Therefore, it is preferable that the sputtering is performed by adding oxygen gas ($O_2$) to Ar gas. In the present preferred embodiment, the InGaZnO film with a thickness of 50 nm is formed with the sputtering using a mixed gas formed by adding $O_2$ gas of 10% in a partial pressure percent to Ar gas. The InGaZnO film is formed to have an amorphous structure. The crystallization temperature of the InGaZnO film having the amorphous structure is generally 500° C. or higher, so that the most part in the film keeps the amorphous structure and is stabilized in this state at room temperature.

Figure 20:
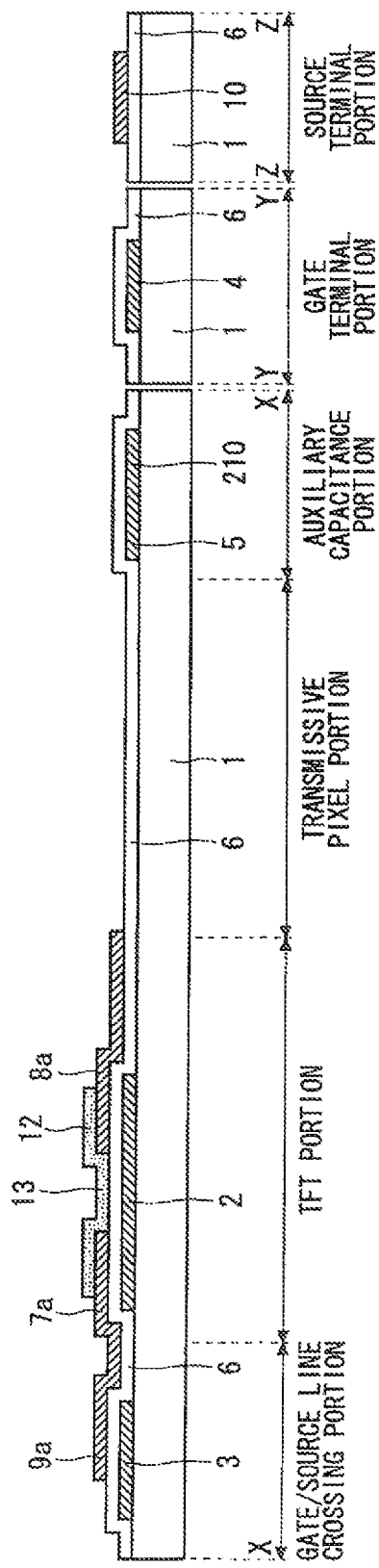

Next, a photoresist pattern is formed by the third photolithography process, and the InGaZnO film is etched by using this pattern as a mask. Thereafter, the photoresist pattern is removed. As a result, the semiconductor film 12 extending over the lower source electrode 7a and the lower drain electrode 8a is formed as illustrated in FIG. 20.

During the etching process of the InGaZnO film having the amorphous structure, wet etching using an oxalic acid solution can be employed. The lower source line 9a, the lower source electrode 7a, the lower drain electrode 8a, and the source terminal 10, which are formed in the previous process, are the crystallized ITO film, and they are not etched by the oxalic acid solution. Therefore, these patterns are not eliminated.

The semiconductor film 12 made of the oxide semiconductor (InGaZnO film) is brought into contact with the lower source electrode 7a and the upper source electrode 7b made of ITO that is also the oxide in order to electrically connect the semiconductor film 12 and the lower and upper source electrodes 7a and 7b. According to this configuration, the interface reaction (oxidation-reduction reaction) between the semiconductor film 12 and the lower and upper source electrodes 7a and 7b is prevented. Accordingly, the contact resistance (interface resistance) between the semiconductor film 12 and the lower and upper source electrodes 7a and 7b can be suppressed low. Consequently, on current and mobility of the TFT 201 can be increased, whereby an effect of enhancing the TFT characteristic can be obtained.

After the semiconductor film 12 is formed, the protection insulating film 14 and the flattening film 30 are formed on the entire upper surface of the substrate 1. In the present preferred embodiment, an oxide silicon (SiO) film with a thickness of 100 nm is formed by using a chemical vapor deposition (CVD) method under the substrate heating condition of about 250° C. to form the protection insulating film 14. In addition, the flattening film 30 is formed by applying an organic resin.

A photoresist pattern is then formed by the fourth photolithography process, and the flattening film 30 and the protection insulating film 14 are etched by using this pattern as a mask, whereby the contact holes 15 to 18 and 21 are simultaneously formed. A dry etching process using fluorine gas can be used for this etching process.

Figure 21:
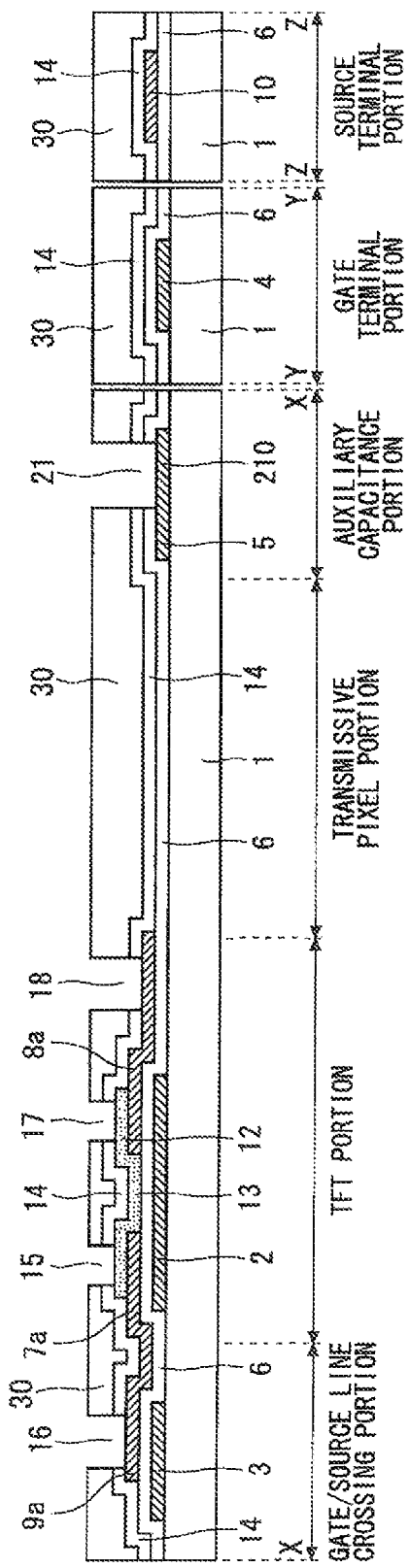

Thereafter, the photoresist pattern is removed. As a result, the contact hole 16 reaching the lower source line 9a, the contact holes 15 and 17 reaching the semiconductor film 12, and the contact hole 21 reaching the auxiliary capacitance line 210 are formed as illustrated in FIG. 21.

In the present preferred embodiment, the protection insulating film 14 is the oxide silicon film. However, the protection insulating film 14 may have a stacked structure including a nitride silicon film, which has excellent barrier property, as an upper layer of the oxide silicon film, for example, since the oxide silicon film has low barrier property (blocking property) to impurity elements affecting the TFT characteristic, such as water content ($H_2O$), hydrogen ($H_2$), sodium (Na), and potassium (K). Alternatively, the protection insulating film 14 may have a single-layer structure of a silicon nitride film.

When the silicon nitride is used for the protection insulating film 14, a wedge might be formed during the formation of the contact hole reaching the surface of the translucent conductive film by the dry etching using fluorine gas, and this wedge might cause an electrical connection failure. The effective structure for preventing the generation of the wedge is such that the protection insulating film 14 is formed to have a stacked structure having at least two layers including an upper silicon nitride film and a lower silicon nitride film, in which the lower silicon nitride film is formed to have a smaller absolute value of a film stress than the upper silicon nitride film. Specifically, the absolute value of the film stress of the lower silicon nitride film is preferably set in the range of 150 MPa to 200 MPa. When the N/Si ratio of the silicon nitride film is increased, the absolute value of the film stress can be decreased, but the N/Si ratio of the upper silicon nitride film is desirably in the range of 1.1 to 1.5. Alternatively, it is also effective that the protection insulating film 14 is formed to have a single-layer structure of a silicon nitride film having a small absolute value of a film stress.

Since the generation of the wedge is prevented, stress is balanced during the formation of the protection insulating film 14, whereby the film-forming condition that makes it difficult to generate the film floating is easy to be employed. Consequently, the film floating of the protection insulating film 14 can be prevented.

Thereafter, a third conductive film that is the material for the upper source electrode 7b, the upper drain electrode 8b, and the common electrode 27 is formed. In the present preferred embodiment, a translucent conductive film is formed as the third conductive film. An ITO film (a mixture ratio of indium oxide $In_2O_3$ and tin oxide $SnO_2$ is 90:10 (wt %), for example) is used as the translucent conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the fifth photolithography process, and the amorphous ITO film is etched by using the photoresist pattern as a mask. Wet etching using a solution containing phosphoric acid+nitric acid+acetic acid is used for this etching process. In this case, since the semiconductor film 12 made of the oxide semiconductor formed in the previous process is covered by the protection insulating film 14, the pattern of the semiconductor film 12 is not eliminated by the etching for the translucent conductive film, whereby the selective etching can be carried out.

Figure 22:
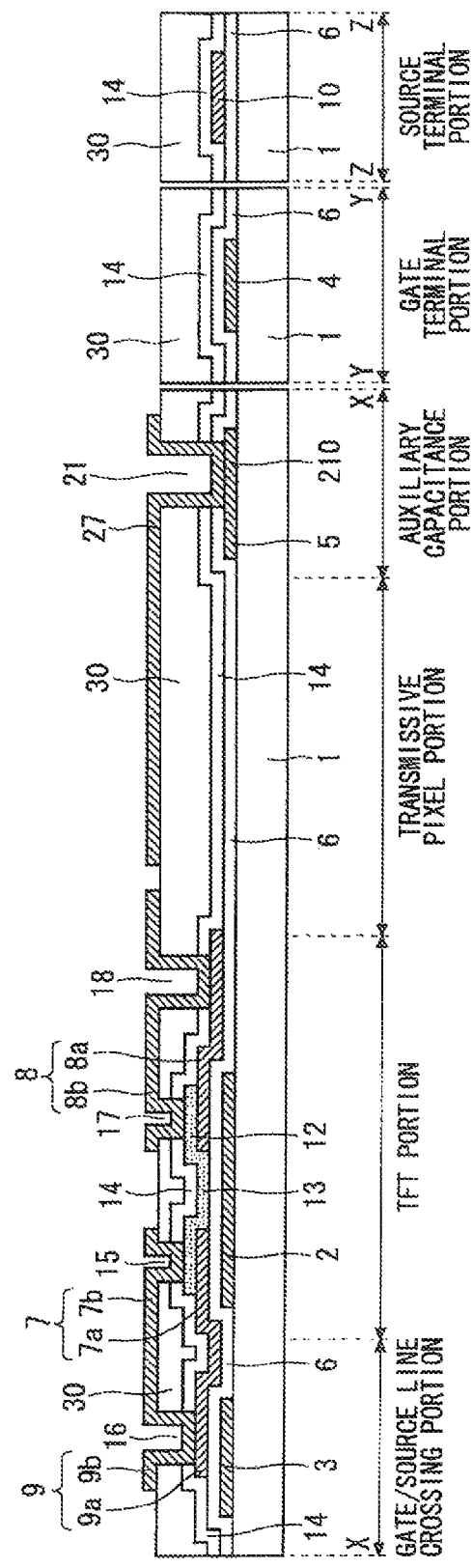

Thereafter, the photoresist pattern is removed. As a result, the upper source line 9b, the upper source electrode 7b, the upper drain electrode 8b, and the common electrode 27 are formed as illustrated in FIG. 22.

Next, an oxide silicon film (SiO) serving as the interlayer insulating film 31 is formed with the chemical vapor deposition (CVD) method. In the present preferred embodiment, the oxide silicon film with a thickness of 300 nm is formed under a substrate heating condition of about 300° C. Since the oxide silicon film has low bather property (blocking property) to impurity elements affecting the TFT characteristic, such as water content ($H_2O$), hydrogen ($H_2$), sodium (Na), and potassium (K), the interlayer insulating film 31 may have a stacked structure including a nitride silicon film (SiN), which has excellent barrier property, as a lower layer of the oxide silicon film, for example.

When the silicon nitride is used for the interlayer insulating film 31, a wedge might be formed during the formation of the contact hole reaching the surface of the translucent conductive film by the dry etching using fluorine gas, and this wedge might cause an electrical connection failure. The effective structure for preventing the generation of the wedge is such that the interlayer insulating film 31 is formed to have a stacked structure having at least two layers including an upper silicon nitride film and a lower silicon nitride film, in which the lower silicon nitride film is formed to have a smaller absolute value of a film stress than the upper silicon nitride film. Specifically, the absolute value of the film stress of the lower silicon nitride film is preferably set in the range of 150 MPa to 200 MPa. When the N/Si ratio of the silicon nitride film is increased, the absolute value of the film stress can be decreased, but the N/Si ratio of the upper silicon nitride film is desirably in the range of 1.1 to 1.5. Alternatively, it is also effective that the interlayer insulating film 31 is formed to have a single-layer structure of a silicon nitride film having a small absolute value of a film stress.

Since the generation of the wedge is prevented, stress is balanced during the formation of the interlayer insulating film 31, whereby the film-forming condition that makes it difficult to generate the film floating is easy to be employed. Consequently, the film floating of the interlayer insulating film 31 can be prevented.

A photoresist pattern is then formed by the sixth photolithography process, and the interlayer insulating film 31, the flattening film 30, the protection insulating film 14, and the gate insulating film 6 are etched by using this pattern as a mask, whereby the contact holes 19, 20, and 33 are simultaneously formed. A dry etching process using fluorine gas can be used for this etching process.

Thereafter, the photoresist pattern is removed. As a result, the contact hole 33 reaching the upper drain electrode 8b, the contact hole 19 reaching the gate terminal 4, and the contact hole 20 reaching the source terminal 10 are formed as illustrated in FIG. 23.

Thereafter, a fourth conductive film that is the material for the pixel electrode 11, the gate terminal pad 25, and the source terminal pad 26 is formed. In the present preferred embodiment, a translucent conductive film is formed as the fourth conductive film. An ITO film (a mixture ratio of indium oxide $In_2O_3$ and tin oxide $SnO_2$ is 90:10 (wt %), for example) is used as the translucent conductive film. An ITO film generally has a stable crystal (polycrystalline) structure at room temperature. Here, the ITO film is formed with a sputtering method by using a gas containing hydrogen (H) into argon (Ar), e.g., a gas formed by mixing hydrogen ($H_2$) gas or water vapor ($H_2O$), whereby the ITO film with a thickness of 100 nm is formed in an amorphous state.

Then, a photoresist pattern is formed by the seventh photolithography process, and the amorphous ITO film is etched by using the photoresist pattern as a mask. Wet etching using a solution containing phosphoric acid+nitric acid+acetic acid is used for this etching process.

Thereafter, the photoresist pattern is removed. As a result, the pixel electrode 11, the gate terminal pad 25, and the source terminal pad 26 are formed. Thus, the structure illustrated in FIG. 17 is completed.

As described above, in the third preferred embodiment, the high-performance TFT substrate 200 in which the oxide semiconductor is used for the semiconductor film 12 in the TFT 201 can be formed by seven photolithography processes.

Upon assembling the liquid crystal display panel, an orientation film and a spacer are formed on the surface of the completed TFT substrate 200. The orientation film is a film for arraying the liquid crystal, and it is made of polyimide. A counter substrate that is separately formed to have a color filter or an orientation film is adhered to the TFT substrate 200. In this case, a gap is formed between the TFT substrate 200 and the counter substrate by the spacer. The liquid crystal fills this gap, whereby the liquid crystal display panel is completed. Finally, a polarizing plate, a wave plate, and a backlight unit are arranged outside the liquid crystal display panel. Thus, a liquid crystal display is completed.

In the present preferred embodiment, the semiconductor film 12 made of an oxide semiconductor having weak chemical resistance is formed after the formation of the lower source electrode 7a and the lower drain electrode 8a, and further, the ITO film that is the crystallized oxide translucent conductive film is used for the lower source electrode 7a and the lower drain electrode 8a. According to this structure, the semiconductor film 12 that is the oxide semiconductor film can selectively be etched. In addition, the semiconductor film 12 and the lower source electrode 7a as well as the lower drain electrode 8a, which are made of oxide, are brought into contact with each other, whereby the semiconductor film 12 and the lower source electrode 7a, and the semiconductor film 12 and the lower drain electrode 8a are electrically connected. Accordingly, the interface reaction (oxidation-reduction reaction) of these components can be prevented, and the interface resistance can be suppressed low.

After the formation of the semiconductor film 12, the protection insulating film 14 and the flattening film 30 are formed to cover the semiconductor film 12 that is the oxide semiconductor film, and the semiconductor film 12 and the upper source electrode 7b as well as the upper drain electrode 8b are electrically connected through the contact holes 15 and 17 formed on the protection insulating film 14 and the flattening film 30. Specifically, the source electrode 7 and the drain electrode 8 are electrically connected to both the upper and lower surfaces of the semiconductor film 12. Accordingly, even if the interface resistance between the semiconductor film 12 and the source electrode 7 or the drain electrode 8 is defective on one of the surfaces of the semiconductor film 12, such defect can be compensated on the other surface. Consequently, the interface resistance can further be reduced, and the occurrence of defect caused by characteristic defect of the TFT 201 can be prevented.

In addition, the source line 9 includes two layers that are the lower source line 9a and the upper source line 9b, in which the lower source line 9a and the upper source line 9b are electrically connected by the plurality of contact holes 16 formed on the protection insulating film 14 and the flattening film 30 with a predetermined interval. Therefore, even if disconnection occurs on one of two layers, this can be compensated by the other one. Accordingly, the generation of defect caused by the disconnection of the source line 9 can be prevented.

As described above, according to the present preferred embodiment, the interface resistance between the semiconductor film 12 and the source electrode 7 as well as the drain electrode 8 can be suppressed low, and the generation of defect caused by the pattern failures of the lines can effectively be prevented, even when an oxide semiconductor is used as the semiconductor film 12 (channel layer) in the TFT 201. Since the oxide semiconductor having high mobility is used for the semiconductor film 12 in the TFT 201, the TFT substrate 200 having high operation speed and a display device using the same can be manufactured with high yield. In other words, a high-performance TFT substrate, and a liquid crystal display can be manufactured with good productivity.

While the invention has been shown and described in detail, the foregoing description is in all aspects illustrative and not restrictive. It is therefore understood that numerous modifications and variations can be devised without departing from the scope of the invention.

What is claimed is:

1. A manufacturing method of a thin film transistor substrate comprising the steps of:
   (a) forming a gate electrode and an auxiliary capacitance electrode on a substrate by using a first conductive film;
   (b) forming a first insulating film to cover said gate electrode and said auxiliary capacitance electrode;
   (c) forming a lower source electrode, a lower drain electrode, and a pixel electrode connected to said lower drain electrode on said first insulating film by using a second conductive film;
   (d) forming a semiconductor film, which is electrically connected to said lower source electrode and said lower drain electrode, on said lower source electrode and said lower drain electrode;
   (e) forming a second insulating film on said lower source electrode, said lower drain electrode, and said semiconductor film; and
   (f) forming an upper source electrode electrically connected to said semiconductor film and said lower source electrode through a contact hole, an upper drain electrode electrically connected to said semiconductor film and said lower drain electrode through a contact hole, and a common electrode electrically connected to said auxiliary capacitance electrode through a contact hole, the upper source electrode, the upper drain electrode, and the common electrode being formed on said second insulating film by using a third conductive film.

2. A manufacturing method of a thin film transistor substrate comprising the steps of:
   (a) forming a gate electrode and an auxiliary capacitance electrode on a substrate by using a first conductive film;
   (b) forming a first insulating film to cover said gate electrode and said auxiliary capacitance electrode;
   (c) forming a lower source electrode and a lower drain electrode on said first insulating film by using a second conductive film;
   (d) forming a semiconductor film, which is electrically connected to said lower source electrode and said lower drain electrode, on said lower source electrode and said lower drain electrode;

(e) forming a second insulating film on said lower source electrode, said lower drain electrode, and said semiconductor film;
(f) forming an upper source electrode electrically connected to said semiconductor film and said lower source electrode through a contact hole, an upper drain electrode electrically connected to said semiconductor film and said lower drain electrode through a contact hole, and a pixel electrode connected to said upper drain electrode, the upper source electrode, the upper drain electrode, and the pixel electrode being formed on said second insulating film by using a third conductive film;
(g) forming a third insulating film on said upper source electrode, said upper drain electrode, and said pixel electrode; and
(h) forming a common electrode, which is electrically connected to said auxiliary capacitance electrode through a contact hole, on said third insulating film.

3. A manufacturing method of a thin film transistor substrate comprising the steps of:
(a) forming a gate electrode and an auxiliary capacitance electrode on a substrate by using a first conductive film;
(b) forming a first insulating film to cover said gate electrode and said auxiliary capacitance electrode;
(c) forming a lower source electrode and a lower drain electrode on said first insulating film by using a second conductive film;
(d) forming a semiconductor film, which is electrically connected to said lower source electrode and said lower drain electrode, on said lower source electrode and said lower drain electrode;
(e) forming a second insulating film on said lower source electrode, said lower drain electrode, and said semiconductor film;
(f) forming an upper source electrode electrically connected to said semiconductor film and said lower source electrode through a contact hole, an upper drain electrode electrically connected to said semiconductor film and said lower drain electrode through a contact hole, and a common electrode electrically connected to said auxiliary capacitance electrode through a contact hole, the upper source electrode, the upper drain electrode, and the common electrode being formed on said second insulating film by using a third conductive film;
(g) forming a third insulating film on said upper source electrode, said upper drain electrode, and said common electrode; and
(h) forming a pixel electrode, which is electrically connected to said upper drain electrode through a contact hole, on said third insulating film.

* * * * *